(12) United States Patent
Iwasaki

(10) Patent No.: US 7,129,466 B2
(45) Date of Patent: Oct. 31, 2006

(54) COLOR IMAGE PICKUP DEVICE AND COLOR LIGHT-RECEIVING DEVICE

(75) Inventor: Tatsuya Iwasaki, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 221 days.

(21) Appl. No.: 10/428,749

(22) Filed: May 5, 2003

(65) Prior Publication Data

US 2003/0209651 A1 Nov. 13, 2003

(30) Foreign Application Priority Data

May 8, 2002 (JP) ............................. 2002-132861
Nov. 11, 2002 (JP) ............................. 2002-326429

(51) Int. Cl.
*H01L 31/00* (2006.01)

(52) U.S. Cl. ............................. 250/214.1; 250/208.1; 257/440; 348/272; 348/280

(58) Field of Classification Search ............ 250/208.1, 250/214.1, 226; 257/40, 431–433, 440; 356/406, 356/407, 416; 348/274, 275, 280, 272
See application file for complete search history.

(56) References Cited

U.S. PATENT DOCUMENTS

| 4,514,755 | A | * | 4/1985 | Tabei | 348/280 |
| 4,677,289 | A | * | 6/1987 | Nozaki et al. | 250/226 |
| 5,424,560 | A | * | 6/1995 | Norman et al. | 257/40 |
| 6,300,612 | B1 | * | 10/2001 | Yu | 250/208.1 |
| 6,586,670 | B1 | * | 7/2003 | Yoshikawa | 136/263 |
| 6,593,558 | B1 | * | 7/2003 | Edgar | 250/208.1 |
| 6,632,701 | B1 | * | 10/2003 | Merrill | 438/70 |
| 6,841,816 | B1 | * | 1/2005 | Merrill et al. | 257/294 |
| 6,864,557 | B1 | * | 3/2005 | Turner et al. | 257/440 |

* cited by examiner

*Primary Examiner*—Stephone B. Allen
*Assistant Examiner*—Davienne Monbleau
(74) *Attorney, Agent, or Firm*—Fitzpatrick, Cella, Harper & Scinto

(57) ABSTRACT

A light-receiving device comprises, on a substrate, a first light-receiving part for detecting light of a first wavelength range, and a second light-receiving part for detecting light of a second wavelength range. At least a part of incident light is transmitted through the first light-receiving part and then received by the second light-receiving part. The central wavelength of the first wavelength range is longer than the central wavelength of the second wavelength range, and the first light-receiving part is composed of an organic semiconductor having an absorption spectral maximum in the first wavelength range.

7 Claims, 15 Drawing Sheets

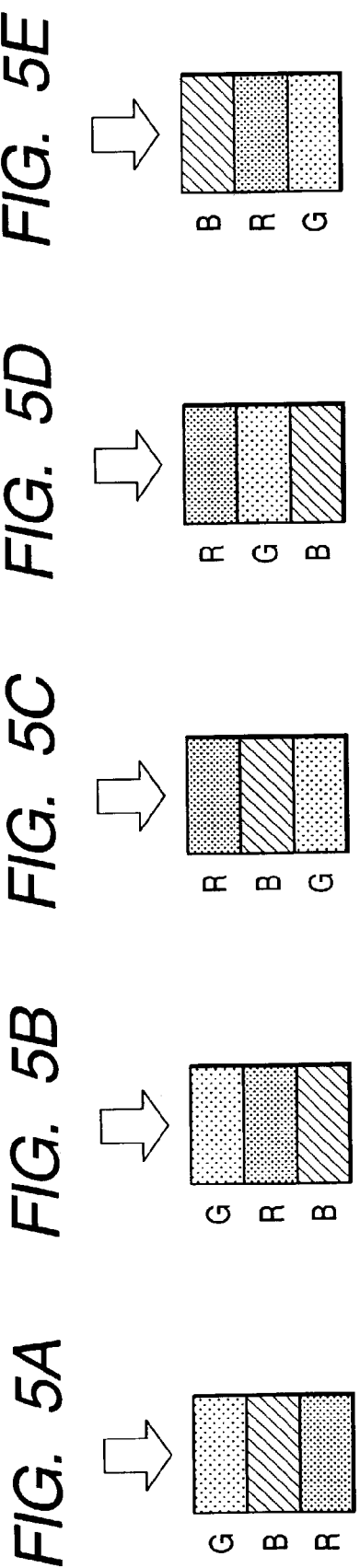

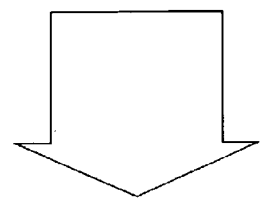
FIG. 6
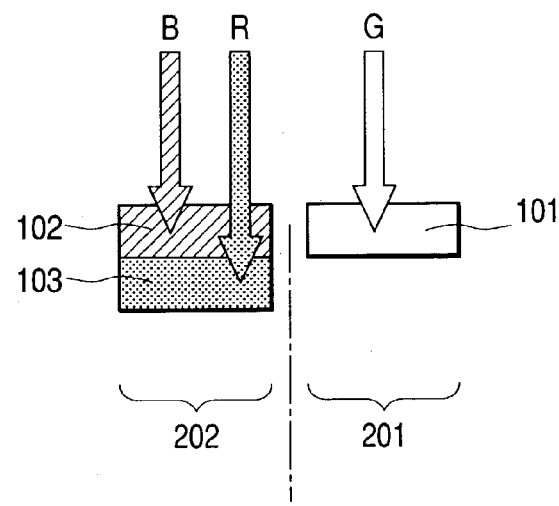
FIG. 7A
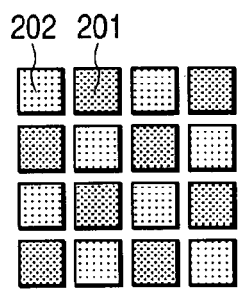
FIG. 7B
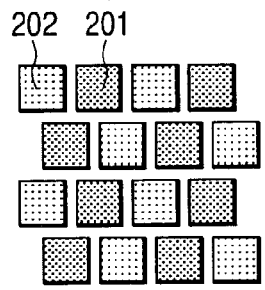
FIG. 7C
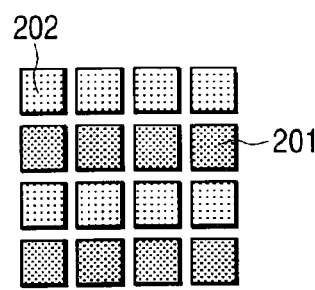
FIG. 7D
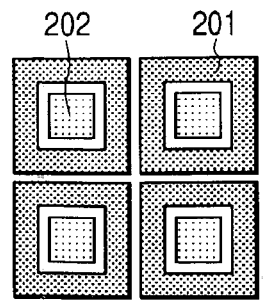

MEROCYANINE

FIG. 22A
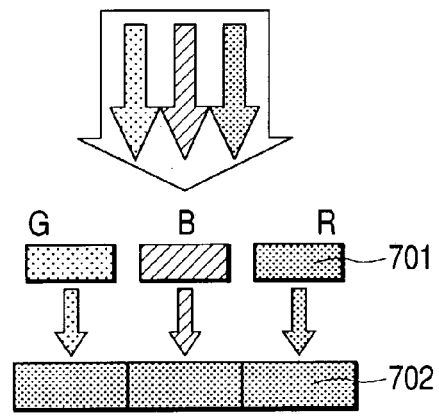
FIG. 22B
| G | B | G | B |
|---|---|---|---|
| R | G | R | G |
| G | B | G | B |
| R | G | R | G |
FIG. 23
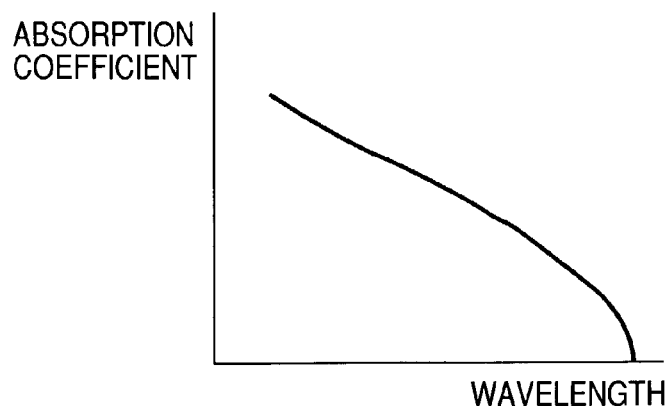

COLOR IMAGE PICKUP DEVICE AND COLOR LIGHT-RECEIVING DEVICE

BACKGROUND OF THE INVENTION

1. Field of the Invention

The present invention relates to a color image pickup device and a light-receiving device.

2. Related Background Art

Conventionally, as light-receiving devices, devices using p-n junctions or p-i-n junctions of compound semiconductors such as crystalline silicon, amorphous silicon and GaAs have been generally used. These light-receiving devices are two-dimensionally arranged to form a plane-type image pickup device, or one-dimensionally arranged to form a line sensor.

In the color image pickup device and line sensor, a color filter system in which color filters each allowing light of a specific wavelength range to pass through are placed is generally used for color separation. That is, in the color image pickup device, color filters 701 are placed on the top of CCD or CMOS sensors 702 as shown in FIGS. 22A and 22B. Examples of color filter systems include a color filter system in which color filters of three primary colors: red (hereinafter abbreviated as R), green (hereinafter abbreviated as G) and blue (hereinafter abbreviated as B) are placed, and a color filter system involving color separation into cyanogen, magenta, yellow and green as complementary color filters.

Also, systems for high image quality include a multiple plate system in which a color image is separated by a color separation prism, and three to four image pickup devices are used. For example, incident light is color-separated by using a prism, and thereafter CCDs are placed-for three colors of R, G and B. In addition, a four-plates system employing two CCDs for G for improving the resolution is known.

However, the color filter system has the following problems: (1) the light amount decreases because a part of light is absorbed by the color filter; and (2) a false color is produced because color separation is done by detecting different colors at different locations. Also, an optical low-pass filter is required for preventing the problem of false color, and a loss of light occurs also in this case.

In the multiple plate system, on the other hand, a high accuracy prism or color separating film (dichroic mirror) is required, and a high level of registration technique is required, thus raising problems such that the cost is increased, the equipment is scaled up and a loss of light occurs in an optical device such as a prism.

For solving the problem of false color, there is a stacked-type image sensor structure. That is, if light-receiving devices sensitive to different colors can be stacked, color separation can be performed at the same (in-plane) location, thus making it possible to prevent the problem of false color.

One example of the stacked-type image sensor is disclosed in U.S. Pat. No. 5,965,875. This structure has light-receiving parts stacked utilizing the dependency of the absorption coefficient of Si on the wavelength, in which color separation is performed in the depth direction thereof. FIG. 23 shows dependency of the absorption coefficient of Si on the wavelength, wherein as the wavelength increases, the level of absorption decreases, and light incident on the surface can enter a long distance in the depth direction. Utilizing this nature, P-N junctions that are light-receiving parts are stacked in three layers in the depth direction, in which light of a shorter wavelength is detected in a light-receiving part located closer to the surface, and light of a longer wavelength is detected in a light-receiving part existing at a deeper location.

This image pickup device is effective for the false color, but has a disadvantage that as far as using light penetration depth dependence on the wavelength in Si, the spectrum range detected in each stacked light-receiving part is broad, and thus color separation is inadequately performed. Specifically, light of a long wavelength (e.g. red) is adsorbed even in a light-receiving part (e.g. blue) detecting light of a short wavelength, and conversely light of a short wavelength (e.g. blue) is absorbed even in a light-receiving part (e.g. red) detecting light of a long wavelength. This raises a problem such that the amount of light substantially converted into a signal decreases to reduce the sensitivity. Also, color separation can be controlled to some extent by designing the depth of the P-N junction of each light receiving part, but there is a tradeoff relationship between the sensitivity and the color separation, and the design is severely limited, for example the improvement in color separation results in a reduction in sensitivity.

It is especially difficult to achieve compatibility between the sensitivity and the color separation for green of high visual sensitivity. For example, in an ordinary visible color image sensor, red, green and blue have peak sensitivities at about 450 nm, about 550 nm and about 650 to 700 nm, respectively, but this device is poor in color purity because the sensitivity peak of green is at 500 nm, which is slightly shifted toward the short wavelength region, and the sensitivity of red is shifted toward the long wavelength region.

In addition, due to the three-layer stacked structure, structures such as a wiring are complicated, fabrication work becomes difficult, and thus the cost is increased.

SUMMARY OF THE INVENTION

In view of the above-described situation, the present invention provides an image pickup device having a high sensitivity, having a high level of color separation capability and being free of color false.

Specifically, the present invention provides a light-receiving device comprising, on a substrate, a first light-receiving part for detecting light of a first wavelength range, and a second light-receiving part for detecting light of a second wavelength range, wherein the device has a structure that at least a part of incident light is transmitted through the first light-receiving part and then received by the second light receiving part, wherein the central wavelength of the first wavelength range is longer than the central wavelength of the second wavelength range, and wherein the first light-receiving part is composed of an organic semiconductor having an absorption spectral maximum in the first wavelength range.

Also, the present invention provides a light-receiving device comprising, on a substrate, a first light-receiving part for detecting light of a first wavelength range, a second light-receiving part for detecting light of a second wavelength range, and a third light-receiving part for detecting light of a third wavelength range, wherein the device has a structure that at least a part of incident light is transmitted through the first light-receiving part and then received by the second light receiving part or third light receiving part, wherein the central wavelength of the first wavelength range is longer than the central wavelength of the second wavelength range and shorter than the central wavelength of the above described third wavelength range, and wherein the first light-receiving part is composed of an organic semiconductor having an absorption spectral maximum in the first wavelength range.

In particular, in the light-receiving device of the present invention, it is preferable that a quantum efficiency curve for the first light-receiving part has a maximum value at a wavelength ranging from 500 to 600 nm, namely the first light-receiving part substantially receives green light.

Also, it is preferable that in the light-receiving device of the present invention, the first light-receiving part is composed of an organic semiconductor, and its mobility is in the range of from 0.001 to 1 $cm^2/Vs$.

Also, in the light-receiving device, it is preferable that the first, second and third light-receiving parts are stacked, and the first light-receiving part is composed of an organic semiconductor, and the second and third light receiving parts are formed in a silicon substrate.

Particularly, in connection to the configuration, in the light-receiving device, it is preferable that the second light-receiving part and the third light-receiving part are arranged at locations of different depths in the silicon substrate, and color separation is performed according to the depth of entrance of light.

In the light-receiving device of the present invention, the above-described organic semiconductor is preferably merocyanine.

More specifically, the present invention provides a stacked-type image pickup device which is an image pickup device with stacked light-receiving parts of colors of R, G and B, wherein the first light-receiving part for incident light is a green light-receiving part.

As another aspect, the present invention provides a light-receiving device comprising a first plane area and a second plane area two-dimensionally arranged on a substrate, a first light-receiving part for detecting light of a first wavelength range being formed in the first plane area, a second light-receiving part for detecting light of a second wavelength range and a third light-receiving part for detecting light of a third wavelength range being stacked in the second plane area, wherein a central wavelength of the first wavelength range is longer than a central wavelength of the second wavelength range and shorter than a central wavelength of the third wavelength range, and wherein the first light-receiving part is composed of an organic semiconductor having an absorption spectral maximum in the first wavelength range.

It is preferable in the above light-receiving device that at least a part of incident light is transmitted through the part for detecting light of the second wavelength range and then received by the part for detecting light of the third wavelength range, and the central wavelength of the second wavelength range is longer than the central wavelength of the third wavelength range.

Also, in the light-receiving device, it is preferable that the first plane area and the second plane area are placed in checker arrangement or enclosed arrangement for the plane arrangement, that the central wavelength of the first wavelength range is longer than one of the above described second and third wavelength ranges, and is shorter than the other, and that particularly the first wavelength range corresponds to green, the second wavelength range corresponds to blue, and the third wavelength range corresponds to red.

Also, in the light-receiving device, it is preferable that the above described substrate is a silicon substrate, and the light-receiving device has parts for detecting light of second and third wavelength ranges placed in the second area of the silicon substrate, a wiring layer placed on the silicon substrate, and a part for detecting light of the first wavelength range placed in the first area on the wiring layer.

Also, in the light-receiving device, it is preferable that the parts for detecting light of second and third wavelength ranges are placed at locations of different depths in the above described silicon substrate, and a transistor or a charge-coupled device is preferably provided in the first area of the silicon substrate.

In addition, the part for detecting light of the first wavelength range may be composed of an organic semiconductor, the organic semiconductor constituting the above described part for detecting light of the first wavelength range and the color filter placed in the second area may have the same material, and the mobility of the organic semiconductor is further preferably in the range of 0.001 to 1 $cm^2/Vs$.

Also, it is preferable for miniaturization of the device that signals detected in the parts for detecting light of the first, and second and third wavelength ranges are amplified by an amplifier placed on the silicon substrate, or charge-transferred by a charge transfer part placed on the silicon substrate.

In addition, the present invention provides a color image pickup device in which a plurality of light-receiving devices each comprising light-receiving parts constituting the above-described structure of the light-receiving device. Also, the light-receiving device alone may be used for purposes other than the pickup of images.

BRIEF DESCRIPTION OF THE DRAWINGS

FIGS. 5A, 5B, 5C, 5D and 5E are schematic sections each showing an example of a stack structure of light-receiving parts of an image pickup device of the present invention;

FIG. 6 is a schematic section showing the configuration of a light-receiving device as the second embodiment and Example 6 of the present invention;

FIGS. 7A, 7B, 7C and 7D each show one example of the plane arrangement of first and second areas in the light-receiving device of the present invention;

FIGS. 22A and 22B each show a conventional ordinary image pickup device;

FIG. 23 shows the absorption coefficient of an inorganic material such as silicon.

DETAILED DESCRIPTION OF THE INVENTION

<First Embodiment>

The first embodiment of the present invention will be described using a typical configuration of a light-receiving device of the present invention shown in FIG. 1.

Figure 1:
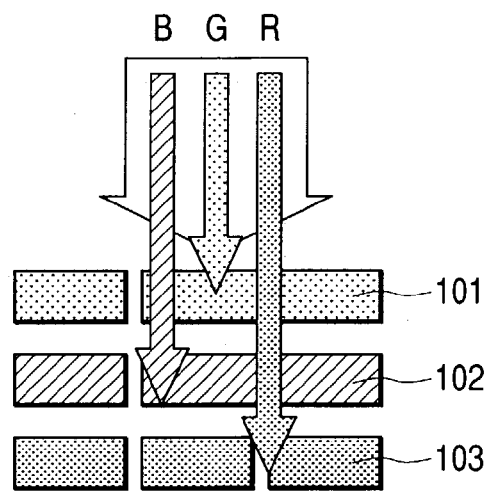
FIG. 1 is a schematic diagram showing the configuration of a light-receiving device as the first embodiment and Example 1 of the present invention.

In FIG. 1, reference numeral 101 denotes a first light-receiving part, reference numeral 102 denotes a second light-receiving part, and reference numeral 103 denotes a third light-receiving part. The light-receiving parts have different ranges of wavelength spectra to be detected. For one of preferred examples, a green light-receiving part is placed in the first layer and in particular, a light-receiving device in which green, blue and red light-receiving parts are stacked in this order with respect to incident light, and an image pickup device in which such light-receiving devices are arranged in a two-dimensional plane are more preferable embodiments.

The image pickup device is a stacked-type color separation image pickup device in which light-receiving parts 101, 102 and 103 sensitive to green, blue and red, respectively, are stacked. First, the image pickup device has an advantage as a first effect that no false color occurs because each color is detected at the same in-plane location due to the stacked-type structure. The false color is a false signal associated with an image component of a space frequency higher than the Nyquist frequency being turned back to an area of a frequency lower than the Nyquist frequency, and is called aliasing. If an image is formed from a signal having large aliasing, so called a moire effect occurs.

One pixel is formed by three light-receiving parts of red, blue and green when the conventional color filter is used. But in this embodiment, the pixel is reduced and the resolution is increased when light-receiving parts of the same sizes are applied, because one pixel is formed by one light-receiving area. Conversely, if the resolutions are the same, a larger area can be provided for the light-receiving part. In this way, an image pickup device of high resolution and an image pickup device of large numerical aperture (high sensitivity) can be achieved as a second effect. That is, a finer and/or bright image can be provided as an image pickup device even if the device is fabricated under the same process rule.

In addition, because the loss of light in the color filter is prevented, the light usage efficiency is enhanced, and the sensitivity is increased. There is also an advantage that the number of required optical parts such as color filters and lowpass filters can be reduced.

In addition, the present invention is characterized in that a light-receiving part for green light is placed in the first layer of the light-receiving part. For achieving this configuration, the adsorption spectrum of the light-receiving part for green light has a characteristic in which strong adsorption is shown only in a specific wavelength range shown in FIG. 2, and has a maximum value in the green range. That is, the green light-receiving part allows red and blue light to pass therethrough.

As means for achieving this light-receiving part, an organic semiconductor material is applied to the light-receiving part. By this stacked-type structure in which the green light-receiving part is placed in the first layer, an image pickup device having a high sensitivity to green of high visual sensitivity can be provided. Also, color purity and sensitivity can be increased compared to a system using the dependency of the absorption coefficient of Si on the wavelength described in the above U.S. Pat. No. 5,965,875. Particularly, in this example, there is a disadvantage that color purity and the sensitivity to red and blue are significantly deteriorated if the sensitivity to green is increased, but in the present invention, an image pickup device having a high sensitivity to green and enabling adequate color separation for red and blue.

Also, compared to the above described multiple plate type image pickup system, only one image pickup device is required, and also the necessity of a high accuracy color separation prism, a dichroic mirror and the like is eliminated, thus contributing to miniaturization and cost reduction.

Figure 2:
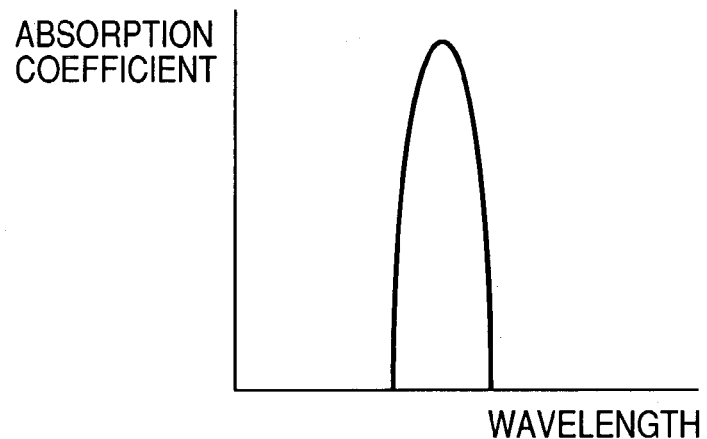
FIG. 2 shows an example of an absorption spectrum of a light-receiving part of the present invention.

In the light-receiving device of FIG. 1, the first wavelength range (green) is detected in the first light-receiving part, the second wavelength range (blue) is detected in the second light-receiving part, and the third wavelength range (red) is detected in the third light-receiving part. At this time, it is preferable that light with the wavelength of about 400 to 500 nm is detected for blue, light with the wavelength of about 500 to 600 nm is detected for green, and light with the wavelength of about 600 nm or greater is detected for red, for example. Also, it is preferable that the first light-receiving part absorbs green light but has a sufficient level of transmittance for red and blue light, and the second light-receiving part absorbs blue light but has a sufficient level of transmittance for red light. That is, it is preferable that the light-receiving part has a absorption spectrum having a maximum value for light to be received as shown in FIG. 2. An organic semiconductor material is preferably applied as a material having such an absorption spectrum and having conductivity.

If the red, blue and green light-receiving parts all show ideal absorption spectra shown in FIG. 2, the stacked order is not specifically limited, but otherwise, an image pickup device having a high sensitivity in green of high visual sensitivity can preferably be provided by employing a configuration in which the green light-receiving part is placed on the top face.

Figure 3:
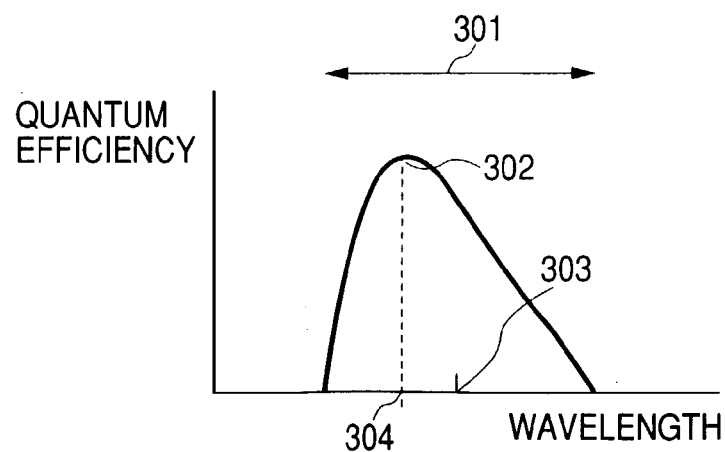
FIG. 3 shows an example of quantum efficiency of the light-receiving part of the present invention.

FIG. 3 shows a detected wavelength range 301, a peak 302, a central wavelength 303 and a wavelength 304 at which the peak is shown. The longitudinal axis represents an amount showing the number of photons converted into electricity to the number of incident photons, namely the quantum efficiency. Here, the wavelength range is a range of wavelengths of light detected in the light-receiving part, and it is the central wavelength that represents a central value of the range of wavelengths.

(If ideally all absorbed light is converted into electricity, the quantum efficiency curve is similar in shape to the absorption spectrum, but practically they may be different due to a loss of a carrier or the like.)

FIGS. 4A to 4D each show a specific example of the arrangement of first, second and third light-receiving parts, and the relation between absorption spectra 401 and 402 and 403 in the present invention. The absorption spectra of the light-receiving parts may be changed to one another.

Figure 4A:
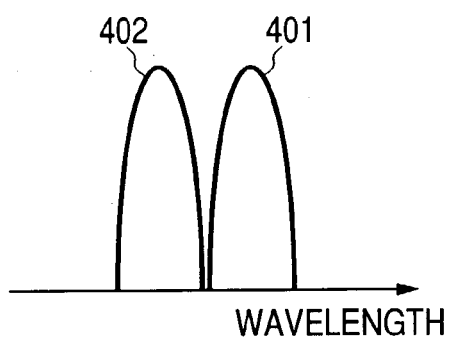
FIGS. 4A, 4B, 4C and 4D each show an example of combination of absorption spectra of first, second and third light-receiving parts of the present invention.

FIG. 4A shows an example of two light-receiving parts placed, each having a quantum efficiency curve having a peak in correspondence with a color.

Figure 4B:
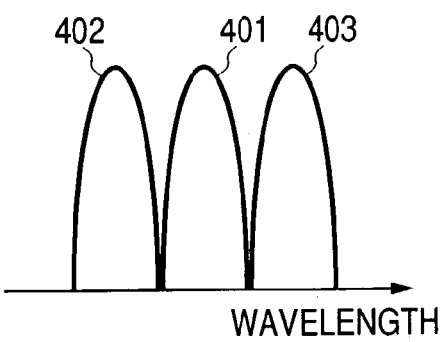

FIG. 4B shows an example of three light-receiving parts placed, each having a quantum efficiency curve having a peak in correspondence with a color. They have separate spectra, representing an ideal case.

Figure 4C:
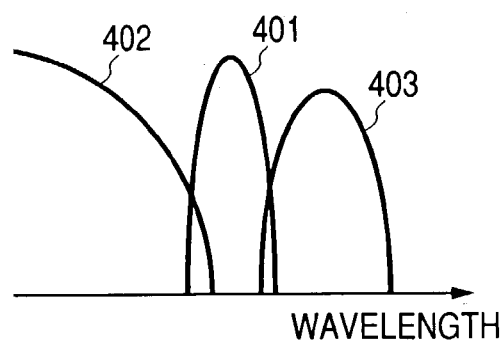

FIG. 4C shows an example of three quantum efficiency curves having overlapping portions.

Figure 4D:
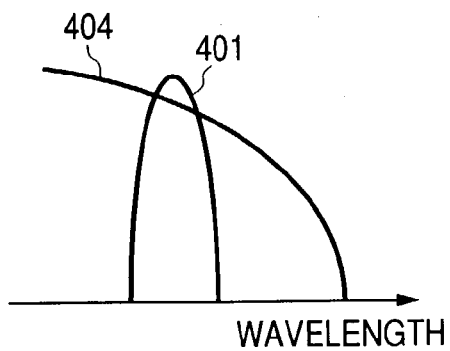

In this example, the light-receiving part having a spectrum at the center is applied as the first light-receiving part to the first layer with respect to incident light, thereby making it possible to ensure adequate color separation for second and third incident light. FIG. 4D shows an example in which the first light-receiving part has absorption spectra with a peak structure 401, and the second and third light-receiving parts have monotonous absorption spectra 404, and they have overlapping portions. This example corresponds to the case described later where an organic semiconductor light-receiving part is used for the first light-receiving part, and light-receiving parts of the same material, e.g. silicon are used for the second and third light-receiving parts. The example of the stacked color separation structure is not limited to that shown in FIG. 1, but a variety of stacked structures may be employed as shown in FIGS. 5A to 5E. For the structure in which light-receiving devices of three primary colors of R, G and B are stacked as an image pickup device, those shown in FIGS. 5A to 5B can be considered. Among them, the structure in which the green light-receiving part is placed in the first layer as shown in FIGS. 5A and 5B can advantageously increase the sensitivity in green of high visual sensitivity.

As the charge transfer (CCD) and the switch, a Si transistor, a TFT of amorphous Si, an organic TFT and the like may be used. For the Si transistor, the CCD technique or C-MOS technique that is an existing technique may be used, and the technique can advantageously achieve a fast and stable drive. On the other hand, by using a TFT made of amorphous silicon or organic semiconductor, an image pickup device having a large area can be achieved.

When the Si transistor or amorphous Si-TFT is used, it is preferable from a viewpoint of technical matching that Si is used not only for a signal reading device but also for the light-receiving device. Further, a hybrid-type image pickup device using Si not only for a signal reading device but also for the light-receiving device is preferable from a viewpoint of technical matching.

As described above, the organic semiconductor is preferably applied for the green light-receiving part of the uppermost layer, and therefore a hybrid structure of the organic semiconductor and silicon (structure constituted by the organic light-receiving device, the silicon light-receiving device and silicon transistor) is preferable. In particular, the structure in which the organic semiconductor is applied for the green light-receiving part of the uppermost layer, and color separation is performed using a difference in optical absorption length in silicon for blue and red is one of the most preferred structures.

By this structure, an image pickup device having a high sensitivity and an adequate color separation capability and being capable of being driven with stability can be achieved. Other examples may include a stacked structure in which blue light and red light are received by organic semiconductor parts and green light is received by a Si part, and a stacked structure in which the organic semiconductor is used for receiving all red, green and blue.

<Second Embodiment>

FIG. 6 is a schematic section illustrating the pixel configuration of the second embodiment of the present invention.

For the configuration of the light-receiving device of this embodiment, two plane areas, namely a first plane area for detecting light of a first wavelength range and a second plane area for detecting light of second and third wavelength ranges are arranged. The light-receiving device is characterized in that a part for detecting light of the second wavelength range and a part for detecting light of the third wavelength range are stacked in the second area.

In FIG. 6, reference numeral 101 denotes a first light-receiving part, reference numeral 102 denotes a second light-receiving part, and reference numeral 103 denotes a third light-receiving part. The first light-receiving part for detecting light of the first wavelength range is placed in a first plane area 201, and the light-receiving parts for detecting light of second and third wavelength ranges, respectively, are stacked in a second plane area 202.

For the range of wavelength spectrum detected in the light-receiving parts, the centrals wavelength of the first wavelength range is preferably longer than one of the central wavelengths of the above-described second and third wavelength ranges and shorter than the other. This is because color separation becomes easier as a difference between the second and third wavelength ranges increases for color separation in the stacked structure in the second and third light-receiving parts.

The light-receiving device of FIG. 6 has light-receiving parts 101, 102 and 103 having sensitivities to three primary colors of green, blue and red, respectively, in which the first plane area 201 having the green light-receiving part and a second plane area 202 having red and blue light-receiving parts stacked in the direction of thickness are provided.

There is an advantage as a first effect that occurrence of false color is alleviated compared to the conventional method in which color filters are used to detect all colors of red, blue and green at different locations, because the red and blue light-receiving parts have a stacked structure, and red and blue colors are detected at the same in-plane location. The false color is based on a false signal associated with an image component of a space frequency higher than the Nyquist frequency being turned back to an area of a frequency lower than the Nyquist frequency, and the false signal is called aliasing. If an image is formed from a signal having large aliasing, so called a moire effect occurs.

One pixel is formed by three light-receiving parts of red, blue and green when the conventional color filter is used. But in this embodiment, the pixel is reduced and the resolution is increased when light-receiving parts of the same sizes are applied, because one pixel is formed by two light-receiving areas. Conversely, if the resolutions are the same, a larger area can be provided for the light-receiving part. In this way, an image pickup device of high resolution and an image pickup device of large numerical aperture (high sensitivity) can be achieved as a second effect. That is, a finer and/or bright image can be provided as an image pickup device even if the device is fabricated under the same process rule.

In addition, because the loss of light in the color filter is prevented, the light usage efficiency is enhanced, and the sensitivity is increased. There is also an advantage that the number of required optical parts such as color filters and lowpass filters can be reduced.

Also, compared to the image pickup device introduced in the prior art, e.g., U.S. Pat. No. 5,965,875, the color purity and sensitivity can be increased in the present invention. Particularly, color purity and the sensitivity to red and blue may be significantly deteriorated if the sensitivity to green is increased in the prior art, but in the image pickup device of the present invention, an image pickup device having a high sensitivity to green and enabling adequate color separation for red and blue.

In addition, structures such as wirings are inclined to be complicated in the configuration in which all three layers are stacked, but in this embodiment, structures such as wirings can be simplified because only two layers are stacked. In this way, there is an advantage that a signal can be read more easily, the cost of fabrication is reduced, and so on.

Also, compared to the above described multiple plate type image pickup system, only one image pickup device is required, and also the necessity of a high accuracy color separation prism, a dichroic mirror and the like is eliminated, thus contributing to miniaturization and cost reduction.

These pixels (first and second areas) are two-dimensionally arranged to fabricate an image pickup device. Plane arrangements of first and second areas include a line arrangement (see FIG. 7C), a checker arrangement (see FIG. 7A), a zigzag arrangement (see FIG. 7B) and an enclosed arrangement (see FIG. 7D) as shown in FIGS. 7A to 7D. The line arrangement and the checker arrangement are preferred in terms of compatibility with CCDs and matrix wirings, and the checker arrangement and the enclosed arrangement are preferred in the sense that the possibility of occurrence of false color is reduced.

A signal electric charge or signal current subjected to photoelectric conversion in the light-receiving part is read in response to selection of a pixel location by a method with so called a charge-coupled device (CCD) or a MOS-type image pickup device (so called a CMOS sensor) using an X-Y address system.

Here, the example of layout of light-receiving parts for respective wavelength ranges is not limited to that described above. As shown in FIGS. 8A to 8F, light-receiving parts can be placed in a variety of ways in the image pickup device of the present invention. For example, a red or blue light-receiving part may be placed for the first light-receiving part, and the second and third light-receiving parts may be stacked in any order.

Figure 8A:
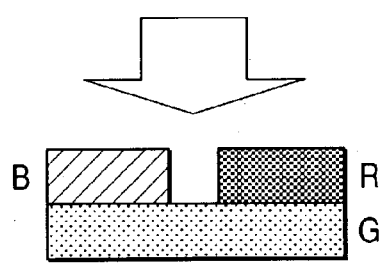
FIGS. 8A, 8B, 8C, 8D, 8E and 8F each show an example of a stack structure of light-receiving devices of the present invention.
Figure 8D:
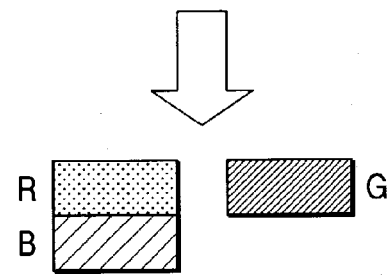
Figure 8B:
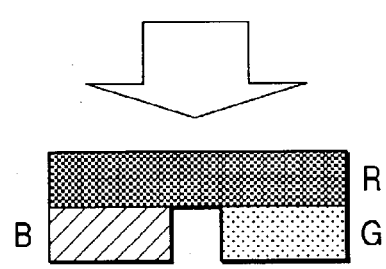
Figure 8E:
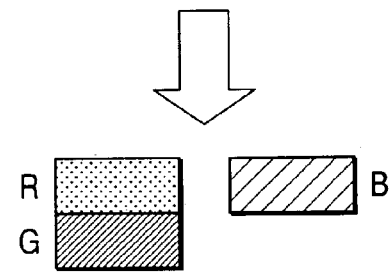
Figure 8C:
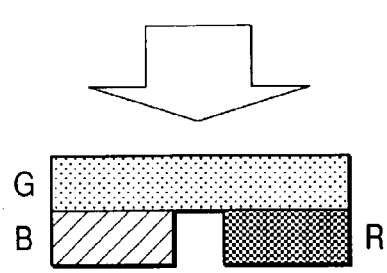
Figure 8F:
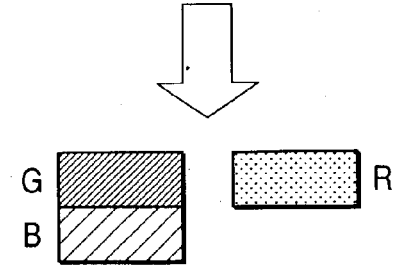

Examples in which the green light-receiving part is placed above or below an image sensor in which red and blue light-receiving parts are arranged as shown in FIGS. 8C and 8A, blue and green light-receiving parts are placed side by side below the red light-receiving part as shown in FIG. 8B, the red light-receiving part is stacked on the green light-receiving part and the blue light-receiving part is placed side by side with the red light-receiving part as shown in FIG. 8E, the green light-receiving part is stacked on the blue light-receiving part and the red light-receiving part is placed side by side with the green light-receiving part as shown in FIG. 8F, and so on can be considered.

In particular, green is preferably detected in the first light-receiving part because of the high visual sensitivity of green, the large difference in wavelength between red and blue leading to easier color separation in a stacked layer configuration, and so on.

Also, in the case where green is detected in the first light-receiving part, it is preferable that blue is detected in the second light-receiving part and red is detected in the third light-receiving part. This is because by forming the second and third light-receiving parts with the same material such as Si, and setting the thickness of the second light-receiving part to a thickness allowing light of the second color to pass through, color separation can be performed using a difference in the adsorption coefficient between the second color and the third color, based on the same principle as that of the conventional image pickup device. This configuration has an advantage that an image pickup device excellent in sensitivity and color separation for green by using a green light-receiving part for the first light-receiving part, and the structure is simplified by forming the second and third light-receiving parts with the same material.

Also, for the configuration in which all three layers are stacked, structures such as wirings are complicated, but in the case of the configuration in which only two layers are stacked, structures such as wirings are simplified. This brings about an advantage that the signal can be read more easily, the image pickup device can be fabricated at a low cost, and so on.

In the second embodiment of the present invention, two plane areas are placed side by side, and a variety of structures and materials may be used for the light-receiving device as described below.

The first light-receiving part 101 receiving light of the first wavelength range in FIG. 6 preferably detects only one color (e.g. green) in a light-receiving device. A color filter may be placed on a light-receiving device such as of silicon, but a light-receiving device selectively detecting a color (e.g. green) is more preferable. For this light-receiving device, an organic semiconductor material may be applied.

The second and third light-receiving parts 102 and 103 receiving light of second and third wavelength ranges, respectively, are placed in a stacked manner to perform color separation. There is a method in which a different material is stacked for each light-receiving part, but a method and a structure in which a difference in the adsorption coefficient of a single material (e.g. silicon) is used to perform color separation are simple and therefore preferable. In this case, a plurality of PN junctions are provided in the depth direction, and light is detected around each junction.

Figure 11A:
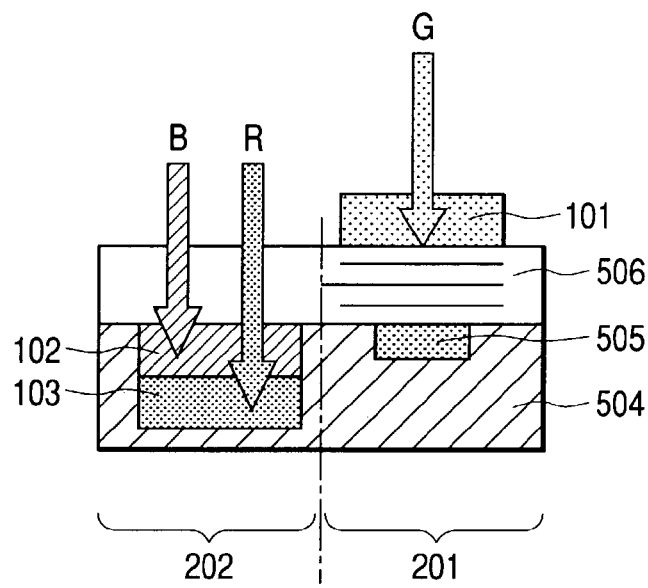
FIGS. 11A and 11B are schematic sections each showing the configuration of a pixel area of the light-receiving device of the second embodiment of the present invention.

Also, it is a preferable example that a light-receiving element made of an organic semiconductor is applied for the first light-receiving part 101, and light-receiving elements made of silicon are applied for the second light-receiving part 102 and the third light-receiving part 103 as shown in FIG. 11A. In the second and third light-receiving parts, color separation is performed using dependency of the adsorption coefficient of silicon on the wavelength. In particular, the configuration in which an organic semiconductor is applied for the first light-receiving part (G), and color separation is performed using a difference in light absorption length in silicon for the second light-receiving part (B) and the third light-receiving part (R) is one of preferred configurations because the design width as to the depth of PN junctions is broadened due to the large difference in wavelength between red and blue, and thus color separation can be performed effectively. By this configuration, an image pickup device having a high sensitivity and an adequate color separation capability, and capable of being driven with stability can be achieved. Reference numeral 201 denotes a first area, reference numeral 202 denotes a second area, reference numeral 504 denotes a silicon substrate, reference numeral 505 denotes a transistor, CCD or the like, and reference numeral 506 denotes a wiring layer ($SiO_2/Al$).

Figure 11B:
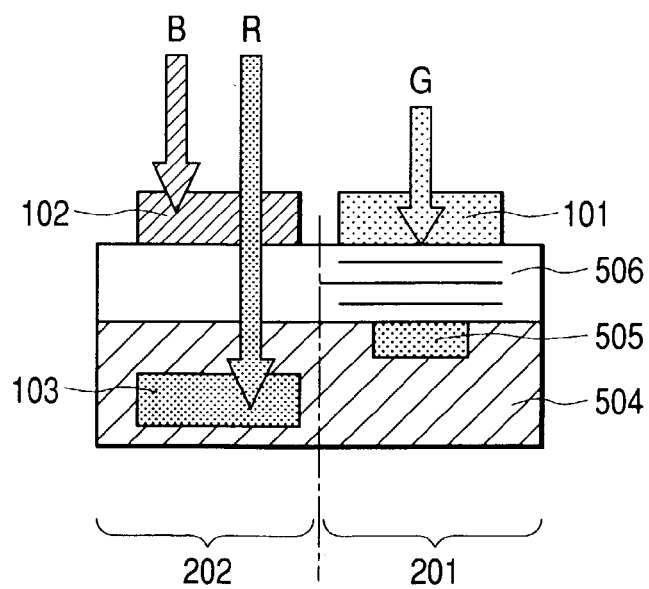

Other examples include a configuration in which light-receiving elements made of an organic semiconductor are applied for the first and second light-receiving parts, and a light-receiving element made of silicon is applied for the third light-receiving part as shown in FIG. 11B.

One of features of these configurations lies in that because a silicon substrate is used as a base, a CCD technique or C-MOS technique that is an existing technique can be used, and the device can be driven at a high speed and with stability.

In addition, by placing the CCD, transistor or the like 505 in the first area 201 of the silicon substrate 504, and placing thereon the first light-receiving part, effective area usage is achieved. That is, by this configuration, light-receiving devices can be placed in high density, thus making it possible to achieve an image pickup device of higher resolution.

Also, from a viewpoint described below, the first light-receiving part is preferably configured to include an organic semiconductor. First, if the first light-receiving part is formed on the wiring 506 or the like, as shown in FIGS. 11A and 11B, it is necessary to fabricate the light-receiving device by film formation, and the organic semiconductor or amorphous Si is preferably applied.

Figure 12:
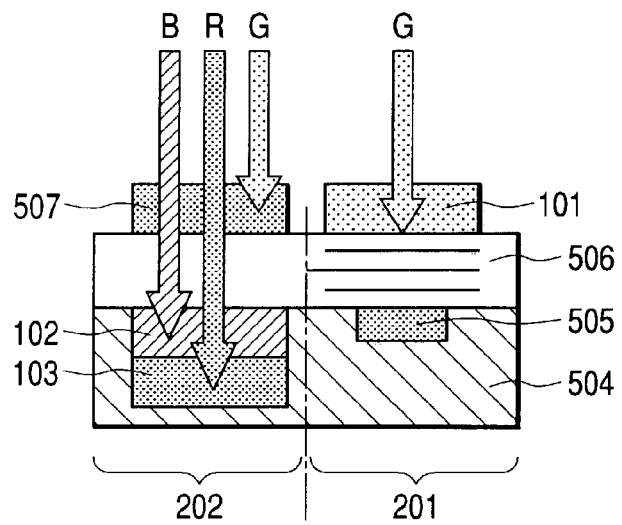
FIG. 12 is a schematic section showing another example of the configuration of the pixel area of the light-receiving device of the second embodiment of the present invention.

Second, as shown in FIG. 12, the organic semiconductor of the first light-receiving part 101 is formed also in the second area 202 in such a manner that the organic semiconductor covers the second area 202, whereby the organic semiconductor can be made to function as a color filter 507 in the second area 202. This configuration can be expected to improve color separation in the second and third light-receiving parts. Reference numeral 201 denotes the first area, reference numeral 504 denotes the silicon substrate, reference numeral 505 denotes the transistor, CCD or the like, and reference numeral 506 denotes the wiring layer ($SiO_2/Al$)

Also, the step of forming the first light-receiving part may partially also function the step of forming the color filter of the second area.

Also, by using a TFT made of amorphous Si or organic semiconductor, an image sensor having a large area can be achieved. This is suitably applied even when the second and third light-receiving parts are composed of amorphous Si.

In the embodiment described above, light-receiving devices of three primary colors of R, G and B are placed as a configuration of the image pickup device, but four or more colors may be used.

Figure 13A:
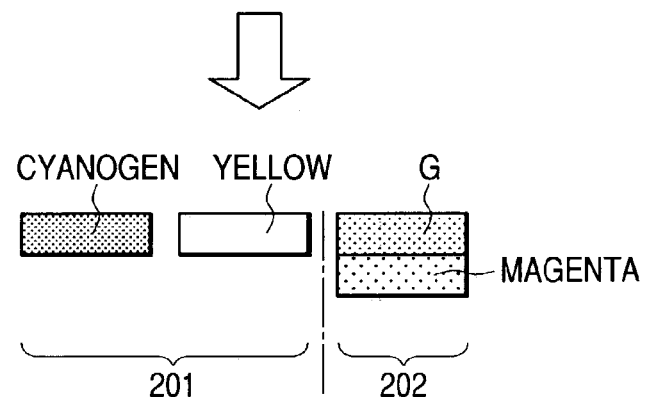
FIGS. 13A and 13B are schematic sections each showing still another example of the configuration of the pixel area of the light-receiving device of the second embodiment of the present invention.
Figure 13B:
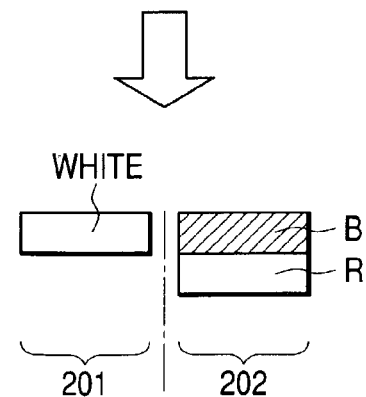

Also, this configuration may be applied to a complementary color separation type color image pickup device. For example, FIG. 13A shows an example of the configuration in which cyanogen and yellow light-receiving parts are placed in the first area 201, and green and magenta light-receiving parts are stacked in the second area 202. Other examples include a configuration in which the first light-receiving part detects the white color (all of red, blue and green colors), and blue and red light-receiving parts are stacked as shown in FIG. 13B.

<Material of Light-Receiving Device>

The material constituting the light-receiving device of the present invention will now be described.

As described previously, in the image pickup device, input light is converted into an electric signal in the light-receiving part (light-receiving device), and the signal is read to form an image. For the light-receiving device, a photoconductive effect and a photovoltaic effect can be used. For the configuration, photoconductive-type, p-n junction-type, Schottky junction-type, PIN junction-type and MSN (metal-semiconductor-metal)-type light-receiving devices and phototransistor-type light-receiving devices are applied.

For the material constituting the light-receiving device, inorganic semiconductor materials such as Si, amorphous Si, CdS, ZnS, Se, SeTeAs, ZnSe and GaAs, and any organic semiconductor material may be used.

As described previously, particularly, by applying a light-receiving device having a peak as shown in FIG. 2 as an adsorption spectrum, an image pickup device excellent in sensitivity and color separation can be provided. In particular, by applying a light-receiving part having a peak as shown in FIG. 2 as an adsorption spectrum of the green light-receiving part, an image pickup device having a high sensitivity to red and blue and being excellent in color separation can be provided as previously described. Because a usual inorganic semiconductor material has an adsorption spectrum shown in FIG. 23, an organic material (organic semiconductor material) is preferably applied as a material showing an adsorption shown in FIG. 2.

Particularly, the light-receiving device using an organic semiconductor will be described in the following. For the organic semiconductor material, a material having an adsorption peak for incident light is preferably applied as described above.

For example, suitable compounds include, but not limited to, acenes represented by perylene, tetracene, pentacene and pyrene and their derivatives; conjugated polymer compounds such as polyacetylene derivatives, polyothiophene derivatives having thiophene rings, poly(3-alkylthiophene) derivatives, poly(3,4-ethylenedioxythiophene) derivatives, polythienylene vinylene derivatives, polyphenylene derivatives having benzene rings, polyphenylene vinylene derivatives, polypyridine derivatives having nitrogen atoms, polypyrrol derivatives, polyaniline derivatives and polyquinoline derivatives; oligomers represented by dimethyl-sexithiophene and quarterthiophene; organic molecules represented by copper phtalocyanine derivatives; discotic liquid crystals represented by triphenylene derivatives; smectic liquid crystals represented by phenylnaphthalene derivatives and benzothiazole derivatives, and liquid crystal polymers represented by poly(9,9-dialkylfluorene-bithiophene) copolymers.

Also, the term "organic semiconductor" described herein refers to organic materials capable of using a movement of a carrier (electron, hole) in a broad sense, which include general dyes and pigments, and for example, dye materials such as rhodamine B, eosine-Y and cumarin may be applied, and azo pigments, squalilium pigments, azurenium pigments and phtalocyanine pigments may be applied.

For the light-receiving layer, these organic semiconductor materials and pigment materials can be mixed or stacked. It can be considered, for example, that an organic semiconductor (pigment) material having controlled absorption spectrum is mixed with an organic semiconductor material excellent in electric conductivity.

Also, the organic compound semiconductor layer for use in the present invention may contain an appropriate dopant for adjusting its electric conductivity. Types of dopants include electron-acceptable $I_2$, $Br_2$, $Cl_2$, ICl, $BF_3$, $PF_5$, $H_2SO_4$, $FeCl_3$ and TCNQ (tetracyanoquinodimethane), electron-donative Li, K, Na and Eu, and alkylsulfonates and alkylbenzene sulfonates as surfactants.

Figure 9A:
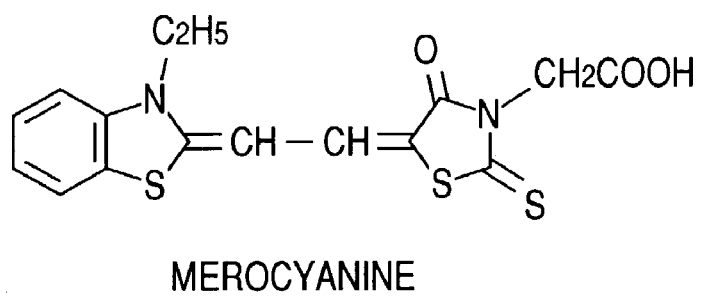
FIG. 9A shows the chemical formula of merocyanine.
Figure 9B:
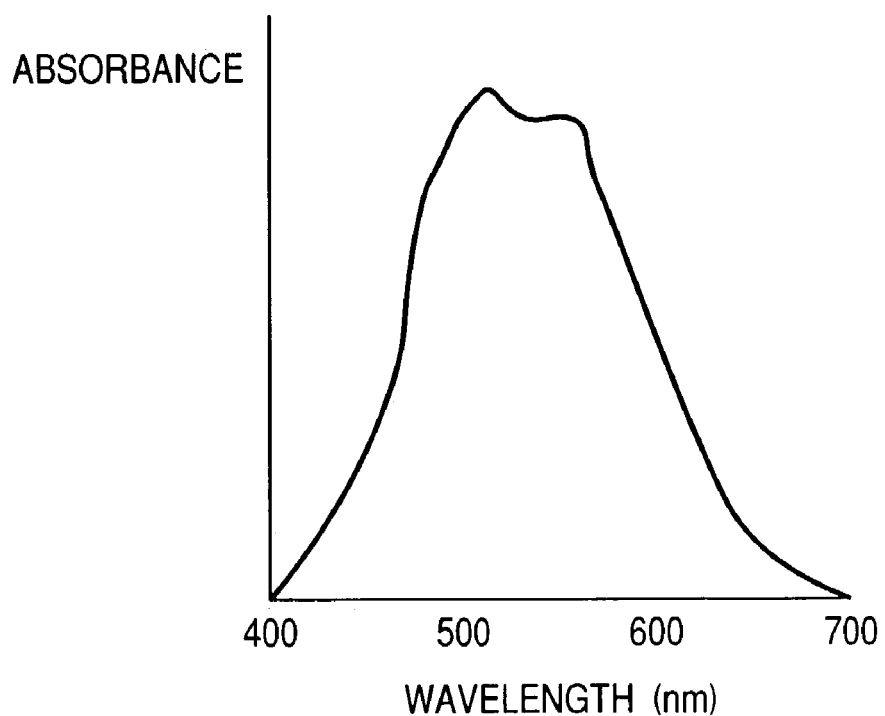
FIG. 9B shows the absorption coefficient of the compound.

FIGS. 9A and 9B show the structural formula of merocyanine and the adsorption spectrum of the compound. By applying this organic semiconductor material to the light-receiving device, a light-receiving device having a sensitivity to a certain color (green) is selectively used. FIGS. 10A to 10E are sectional views showing an example in the organic light-receiving device of the present invention.

Figure 10A:
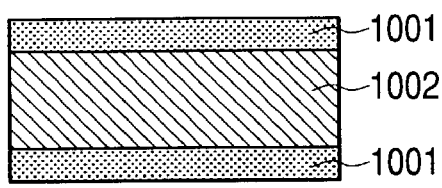
FIGS. 10A, 10B, 10C, 10D and 10E are schematic sections each showing an example of configuration of an organic light-receiving device.

FIG. 10A shows a single-layered structure with a light-receiving layer 1002 (organic semiconductor layer) sandwiched between upper and lower electrodes 1001.

Figure 10B:
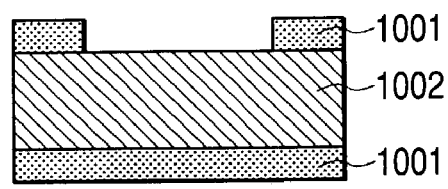

FIG. 10B shows a single-layered structure in which electrodes are pattern-formed and an opening is provided as a light entrance portion.

Figure 10C:
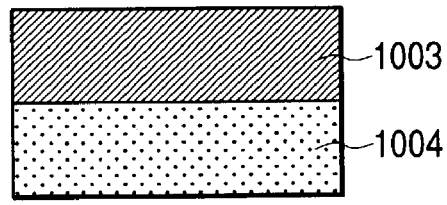

FIG. 10C shows a two-layered structure with two types of organic semiconductor layers stacked, for example a structure with a p-type organic semiconductor 1003 and a n-type organic semiconductor 1004 stacked to form a pn-type light-receiving device.

Figure 10D:
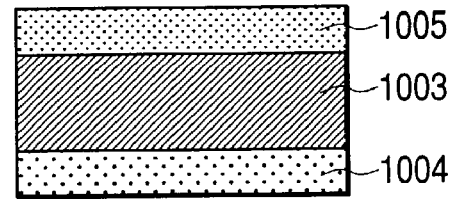

FIG. 10D shows a three-layered structure with three types of organic semiconductor layers stacked, for example a structure with the p-type organic semiconductor 1003, an i-type organic semiconductor 1005 and the n-type organic semiconductor 1004 stacked to form a pin-type light receiving device, and a structure with each layer sandwiched by a light-absorbing layer and a carrier transportation layer.

Figure 10E:
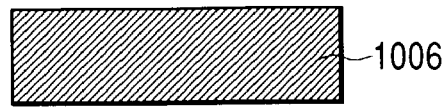

FIG. 10E shows a multi-layered structure 1006 with multiple layers consisting two types of organic semiconductor materials different in ionization potential and electronic affinity stacked.

However, the structures shown in FIGS. 10A to 10E are a basic device structure, and the structure of the organic light-receiving device is not limited thereto. A variety of layer structures can be adopted such that an insulating layer is provided in the interface between the electrode and the organic light-receiving layer, an adhesive layer or interference layer is provided therein, and an electron injection layer with high electron injection efficiency is interposed in the interface between the cathode and the electron transportation layer, for example.

Also, for the carrier transportation layer, materials such as aluminum quinolinol complex derivatives (represented by Alq3) may be used, and for a hole transportation layer 6, for example, materials such as triphenyldiamine derivatives (represented by α-NPD and TPD) may be used.

It is preferable that the organic semiconductor material applied to the light-receiving layer is excellent in film properties and has a high mobility to enable alleviation of carrier deactivation and high-speed response. If the intermolecular bonding is strengthened for increasing the mobility, on the other hand, the bandwidth tends to increase and the adsorption spectrum tends to become broad. From a viewpoint of this situation, the inventor has conducted vigorous studies and consequently found that the mobility is preferably in a certain preferred range for achieving an adsorption coefficient having a peak and characteristics as a light-receiving device. The reason for this is that the adsorption spectrum tends to become broad if the mobility is too high, and the speed of response tends to decrease to an impractical level as a light-receiving device if the mobility is too low. In the present invention, for example, the appropriate mobility is in the range of from $10^{-6}$ to 10. This enables the light-receiving device selectively receiving green light with a sufficient level of transmittance (e.g. 50%) with wavelengths of 450 nm (blue) and 650 nm (red) and absorption of 550 nm (green). The mobility is particularly preferably in the range of from $10^{-3}$ to 1 $cm^2/Vs$.

In the organic light-receiving device, the layer including an organic compound is formed by the dry film-formation method or wet film-formation method. Specific examples of the dry film-formation method include physical vapor growth methods such as a vacuum evaporation method, an ion plating method and a MBE method or CVD methods such as plasma polymerization. For the wet film-formation method, a cast method, a spin coat method, a dipping method, a LB method and the like are used.

The thickness of the light-receiving layer, which also depends on its adsorption coefficient, is reduced to a thickness smaller than 10 µm, preferably equal to or smaller than 5 µm, more preferably in the range of from 0.001 to 0.5 µm.

The electrode for use in the present invention is not specifically limited as long as it is made of conductor, and for example, metal materials such as Al, Cu, Ti, Au, Pt, Ag and Cr, and inorganic materials such as polysilicon, siliside, ITO (Indium Tin Oxide), ZnO and $SnO_2$ are suitably used, but conductive polymers represented by high-doped polypyridine, polyacetylene, polyaniline, polypyrrol and polythiophine, and conductive inks with carbon particles and silver particles dispersed therein may be used. These electrode materials may be used alone or in combination of two or more types.

A signal of the organic light-receiving device can be fetched based on a normal method of fetching a signal from a light-receiving device of silicon. For example, a fixed amount of bias charge is injected in a storage diode (refresh mode), and the fixed amount of charge is stored (photoelectric conversion mode), followed by reading a signal charge. The organic light-receiving device itself may be used as a storage diode, or a storage diode may be separately provided. For reading the signal charge, the above-described method of reading the CCD or CMOS sensor can be applied.

The substrate for use in the image pickup device of the present invention is not specifically limited, but transparent substrates such as silicon substrates, glass, quartz and plastic sheets, and opaque substrates such as metal substrates and ceramic substrates are used.

Furthermore, a protective layer or sealing layer may be provided for a fabricated device in order to prevent the device from contacting oxygen, water and the like. The protective layer includes inorganic material films such as a diamond thin film, a metal oxide and a metal nitride, polymer films such as fluororesin, polyparaxylene, polyethylene, silicone resin and polystyrene resin, and photocurable resins. Also, the device portion may be covered with glass, a gas impermeable plastic, a metal or the like, and the device itself may be packaged with an appropriate sealing resin. In this case, a material excellent in water absorption property can be provided in the package.

<Method of Reading Signal>

The image pickup device has a function of photoelectric conversion (light-receiving device), a function of storing converted signals, a function of reading out stored signals, a function of selecting pixel locations to read out and the like.

The signal charge or signal current subjected to photoelectric conversion in the light-receiving part is stored in the light-receiving part itself or an additionally provided capacitor. The stored charge is read together with response to selection of the image location by the charge-coupled device (CCD) or the MOS-type image pickup device using an X-Y address system (so called CMOS sensor). The method of transferring and reading a signal using a CCD includes a method in which a charge transfer part for transferring the charge signal of the pixel to an analog shift register by a transfer switch is provided, and the signal is read in accordance with the output terminal by the operation of the register. There are a line address type system, a frame transfer type system, an interline transfer type system and a frame interline transfer system and the like. Also, for the CCD, a two-phase structure, a three-phase structure, a four-phase structure and a buried channel structure are known, but any structure may be applied without limitation.

Other address selection methods include a method of selecting pixels one after another by a multiplexer switch and a digital shift register and reading to a common output line as a signal voltage (or charge). An image pickup device of X-Y address operation arrayed in a two-dimensional form is known as a CMOS sensor. In this image pickup device, a switch provided in the pixel connected to the point of intersection of X-Y is connected to a vertical shift register, and when the switch is turned on by a voltage from a vertical scan shift register, a signal read from a pixel provided in the same row is read to the output line in the column direction. This signal is read from the output terminal one after another through the switch driven by a horizontal scan shift register.

For reading the output signal, a floating diffusion detector and a floating gate detector may be used. Also, an improvement in S/N can be achieved by providing a signal amplification circuit in the pixel area, using a method of correlated double sampling or the like.

For signal processing, gamma correction by an ADC circuit, digitization by an AD converter, luminance signal processing and color signal processing may be performed. The color signal processing includes white balance processing, color separation processing and color matrix processing and the like. When using the NTSC signal, processing for converting the RGB signal into the YIQ signal may be performed.

By the present invention, an image pickup device having a high sensitivity and a high level of color separation capability and being free from false color could be achieved in the way described above. The image pickup device of the present invention can be applied for any image pickup device such as those of digital cameras, video cameras, facsimiles, scanners, copiers and X-ray image sensors. Also, it can be used not only as an image pickup device, but also as any optical sensor such as a color light-receiving device, a biosensor and a chemical sensor as a single product.

The present invention will be described below using Examples. However, the present invention is not limited to the Examples described below, but any configuration and production method thereof may be applied as long as they are not deviated from the concept described above.

EXAMPLE 1

In this Example, the superiority of the image pickup device having a configuration shown in FIG. 1 was demonstrated by numerical estimation.

As shown in FIG. 1, the image pickup device is a stacked type image pickup device in which a light-receiving part 101 for detecting green light, a light-receiving part 102 for detecting blue light, and a light-receiving part 103 for detecting red light are stacked in this order. The light-receiving part constituted by an organic semiconductor having a peak of an absorption spectrum for green light is used, and light-receiving parts made of silicon for blue light and red light are used, as a model case. Blue light and red light are separated using a difference in absorption length in silicon.

In the configuration used here, the first light-receiving part corresponds to the green light-receiving part, and the second light-receiving part corresponds to the blue light-receiving part and the third light-receiving port corresponds to the red light-receiving part.

Also, the red light is detected by the red light-receiving part after transmitting the green and blue light-receiving parts.

The results obtained in accordance with the following calculation model.

A normal distribution having a central wavelength of 0.55 μm and a standard deviation of 0.03 μm as an absorption spectrum similar in shape to a color filter was assumed as the absorption spectrum for the green light-receiving part, and calculations were made with a model device using stacked-type light-receiving devices of Si for red and blue. At this time, the depths at which the blue and red light-receiving parts were located in the silicon substrate were about 0.15 μm and about 1.5 μm from the surface of Si, respectively.

Comparative Example 1 represents an example of the configuration shown in U.S. Pat. No. 5,965,875 in which color separation of red, blue and green is performed in the depth direction of the silicon substrate. At this time, the depths of the blue, green and red light-receiving parts in the silicon substrate were 0.2 μm, 0.6 μm and 2.0 μm, respectively.

Figure 24:
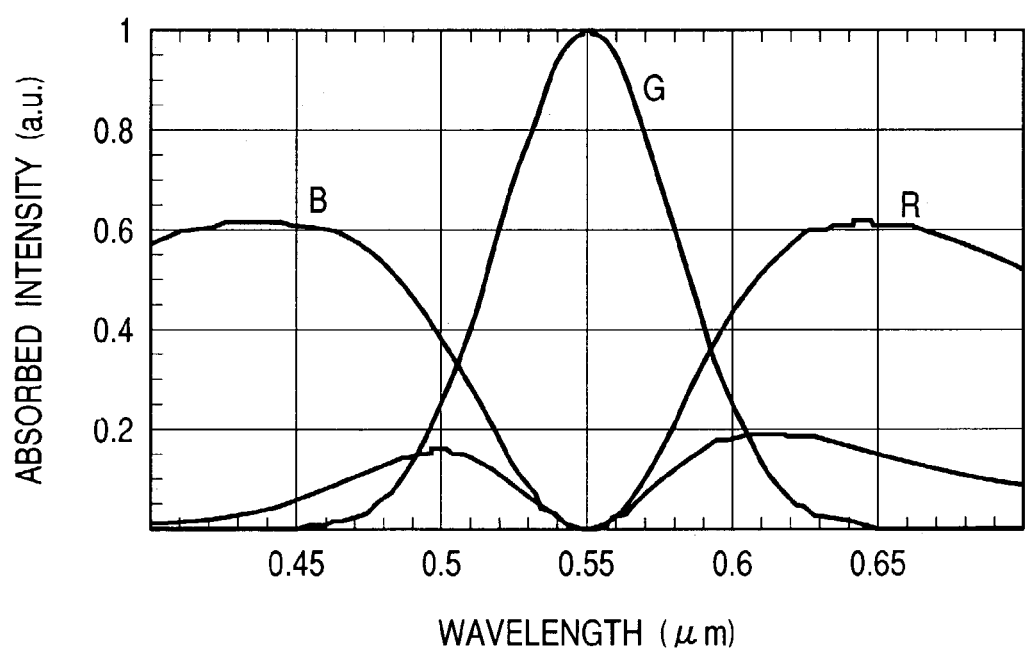
FIG. 24 illustrates Example 1.

The results of calculating spectral sensitivities in the light-receiving parts of this system are shown in FIG. 24. Curves of G, B and R in FIG. 24 show spectral sensitivities of the light-receiving parts 101, 102 and 103, respectively. Also, the results of calculating the amounts of incident light and color separation capabilities for respective colors from this graph are shown in Table below.

TABLE 1

|  | Comparative Example 1 | Example 1 |
|---|---|---|
| Blue Light Reception Ratio | ~38% | 62% |
| Green Light Reception Ratio | ~38% | 100% |
| Red Light Reception Ratio | ~38% | 62% |
| Blue Color Separation Degree | ~68% | 91% |
| Green Color Separation Degree | ~48% | 100% |
| Red Color Separation Degree | ~53% | 80% |

Here, the light reception ratio refers to the value showing a ratio of light detected in a desired light-receiving part to incident light under monochromatic light irradiation, and for example, the blue light reception ratio is a ratio of blue light capable of being received by the blue light-receiving part to incident blue light (e.g. light with the wavelength of 450 nm). The image pickup device with a high light reception ratio for a certain color corresponds to a high sensitivity to the color.

Also, the color separation ratio is a value introduced as an index showing the color separation capability of the image pickup device, which corresponds to a ratio of signal assigned to a desired color to sum of RGB signals under monochromatic light irradiation. For example, the blue color separation ratio is a value expressed by (amount of light detected by blue light-receiving part)/((amount of light detected by blue light-receiving part)+(amount of light detected by green light-receiving part)+(amount of light detected by red light-receiving part)) when blue light (wavelength of 450 nm) enters.

Here, as the wavelengths for blue, green and red, the values 450, 550 and 650 nm were used, respectively.

As apparent from the Table, an image pickup device excellent in sensitivity (or light reception ratio in Table) and color separation can be provided by applying the configuration of this example in which the light-receiving device selectively receiving green light is placed in the uppermost layer.

EXAMPLE 2 AND COMPARATIVE EXAMPLE 2

In this Example, a CMOS sensor-type image pickup device having a configuration based on Example 1 was achieved.

The image pickup device is a stacked-type image pickup device in which a light-receiving part for detecting the green light, a light-receiving part for detecting blue light, and a light-receiving part for detecting red light are stacked in this order similarly as in the case of Example 1.

Figure 14:
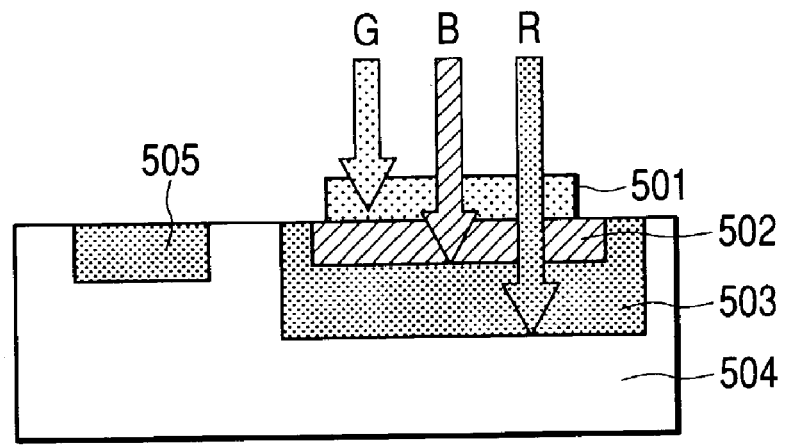
FIG. 14 is a conceptual view showing the light-receiving device of Example 2.

In this Example, as shown in the outlined configuration of a pixel area in FIG. 14, a stacked-type image pickup device is formed that employs an organic light-receiving device using a light absorption layer of an organic semiconductor made of merocyanine of which the structural formula and absorption intensity are shown in FIGS. 9A and 9B as the green light-receiving part, and using light-receiving parts of Si for the red and blue light-receiving parts. That is, green light is absorbed and detected by a light-receiving part 501 composed of an organic semiconductor, blue light is detected by a second light-receiving part 502 provided at a shallow depth from the surface in a silicon substrate 504, and red light is detected by a third light-receiving part 503 provided at a deeper depth from the surface of the substrate. That is, color separation for blue and red is performed using the dependency of the absorption coefficient on the wavelength in silicon. Each received light is read via an amplifier 505 provided on the silicon substrate.

First, a stacked-type silicon image sensor with a blue light-receiving part (pn junction) and a red light-receiving part stacked on a silicon substrate was fabricated based on the conventional method of fabricating a CMOS sensor.

P-type wells and n-type wells were formed on the silicon substrate having n-type wells by the normal ion doping method to obtain a structure having stacked pn junctions. The pn junctions serve as blue and red light-receiving parts, respectively. The depths of the blue and red light-receiving parts were about 0.15 µm and 1.5 µm.

A green organic light-receiving part was stacked thereon using merocyanine. A zinc oxide film with the thickness of 100 nm was formed by the spattering method, and a merocyanine film with the thickness of 100 nm, and an Ag film with the thickness of 80 nm were formed by vacuum evaporation to fabricate a transparent electrode in the light-receiving part. The Ag film was patterned in such a manner that an opening was provided in the center of the light-receiving part.

The green light-receiving part is connected to the silicon transistor of each pixel, and a signal of the part is read in the same way as a usual CMOS sensor. That is, a switch provided in the pixel connected to the point of intersection of X-Y is connected to a vertical shift register, and when the switch is turned on by a voltage from a vertical scan shift register, a signal read from a pixel provided in the same row is read to the output line in the column direction. This signal is read from the output terminal one after another through the switch driven by a horizontal scan shift register. A four-transistor amplifier was placed in each pixel.

On the other hand, as Comparative Example 2, a CMOS sensor with color separation of red, blue and green performed in the depth direction was prepared based on U.S. Pat. No. 5,965,875. The depths of blue, green and red light-receiving parts in the silicon substrate were 0.2 µm, 0.6 µm and 2.0 µm, respectively.

The image pickup device of this Example was free of false color.

Also, the image pickup device of this Example was excellent in color separation and sensitivity compared to Comparative Example 2. Particularly, it had a high sensitivity and a high color separation capability for green. The sensitivity to red was 1.1 times greater, the sensitivity to blue was 1.3 times greater, and the sensitivity to green was 1.4 times greater compared to Comparative Example. Also, the color separation capability of red was 1.1 times greater, the color separation capability of blue was 1.3 times greater, and the color separation capability of green was 1.6 times greater compared to Comparative Example.

Also, in this Example, the device can be driven with a relatively low voltage to reduce a power consumption because the signal is read by the Si-CMOS sensor.

EXAMPLE 3

Figure 15:
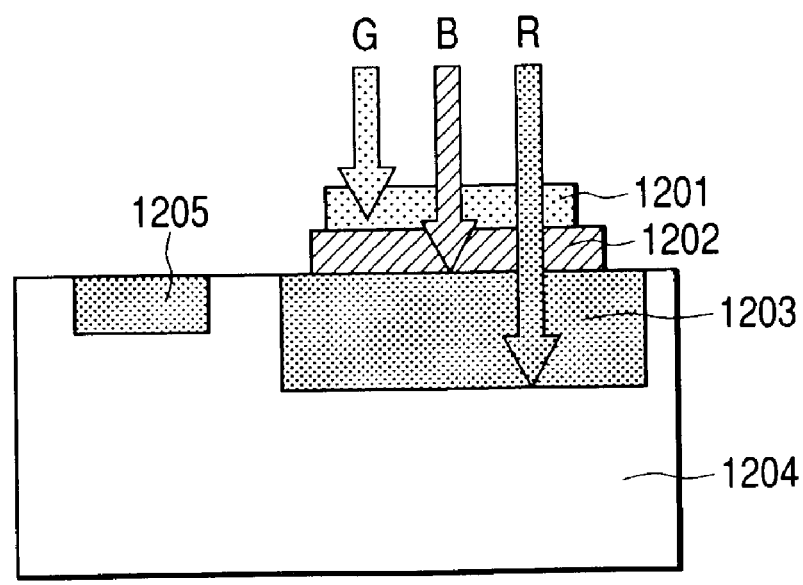
FIG. 15 is a conceptual view showing the light-receiving device of Example 3.

In this Example, an organic light-receiving part for green light was used for the uppermost layer, an organic light-receiving part for blue light was used for the middle layer, and a light-receiving part made of silicon was used for the lowermost layer. The structure is shown in FIG. 15. For reading the signal, a CCD 1205 in a silicon substrate 1204 is used for blue and green as well as red. The CCD was an interline-type CCD.

First, based on the usual method of fabricating a CCD, a red light-receiving part 1203 and a charge transfer part were fabricated in the silicon substrate, and organic light-receiving devices for blue and green were stacked thereon in this order in the same manner as Example 2 to fabricate the CCD. DCM 1 was used for the light-receiving layer of blue light-receiving part 1202, and eosine Y was used for the green light-receiving layer 1201.

In the light-receiving part, a zinc oxide film with the thickness of 100 nm was formed by the spattering method, an aluminum trisquinolinol (hereinafter referred to as Alq3) film was formed in thickness of 50 nm as an electron transportation layer by the vacuum evaporation method, a DCM1 film with the thickness of 100 nm was formed as a blue adsorption layer, and an N,N'-bis(3-methylphenyl)-N, N'-diphenyl-(1,1'-biphenyl)-4-4'-diamine (hereinafter abbreviated as TPD) film with the thickness of 150 nm was formed as a hole transportation layer by the vacuum evaporation method. In addition, Eosine Y with the thickness of 100 nm, and a polypyridine film with the thickness of 80 nm were formed. The polypyridine film was patterned in such a manner that an opening was provided for the light-receiving part. The TPD film and the polypyridine film were connected to a charge accumulation part of the silicon substrate via electrodes of aluminum, W-Si and the like.

The image pickup device of this Example was free of false color and excellent in color separation and sensitivity. Particularly, it had a high sensitivity to green.

Also, in this Example, it is characterized in that the S/N is relatively high because the signal is read by the Si-CCD.

EXAMPLE 4

Figure 16:
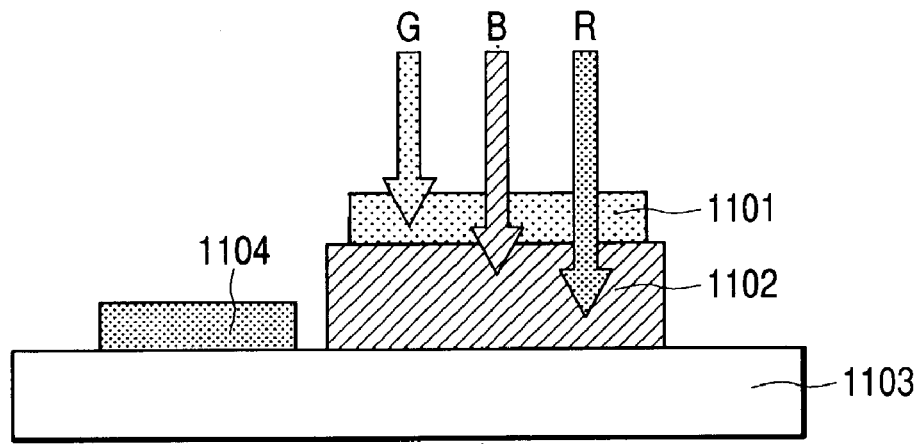
FIG. 16 is a conceptual view showing the light-receiving device of Example 4.

This Example shows an example of a color line sensor, as shown in the outlined sectional view of the pixel area in FIG. 16, in which an organic light-receiving device 1101 for green light was placed as the uppermost layer, and a light-receiving part 1102 made of a-Si capable of performing color separation for blue and red by the absorption length, and further a TFT, capacitor or the like 1104 made of a-Si were placed as the lower layer on a glass substrate 1103.

First, a glass substrate having a TFT transistor made of amorphous Si (a-Si) was prepared. Subsequently, a p-i-n-i-p-type tandem a-Si light-receiving part was prepared. The thicknesses of their type layers were 80 nm, 700 nm, 180 nm, 90 nm and 10 nm in the order from the bottom layer. This a-Si light-receiving part is capable of making the switch between the reception of light in an upper pin part and the reception of light in a lower pin part by switching the voltage between +2.5 V and −2.5 V. The a-Si was formed by the PECVD (plasma enhanced chemical vapor deposition) method.

In addition, an organic light-receiving part for green light was formed thereon.

The organic light-receiving part for green light was fabricated by forming a zinc oxide film with the thickness of 100 nm in the light-receiving part by the spattering method, followed by forming a merocyanine film with the thickness of 100 nm and a TDP film as a charge transportation layer with the thickness of 1 μm, and forming an Ag film with the thickness of 80 nm as an electrode, by vapor deposition. The Ag film was patterned in such a manner that an opening was provided in the center of the light-receiving part. The Ag electrode was connected to the capacitor made of a-Si and further the TFT via electrodes of aluminum and the like. The signal from each light-receiving part was read via the TFT by the address selection method.

The image pickup device of this Example was free of false color and excellent in color separation and sensitivity. Particularly, it had a high sensitivity to green.

Also, in this Example, an image pickup device having a large area could be achieved because the signal was read using the TFT using a-Si.

EXAMPLE 5

Figure 17:
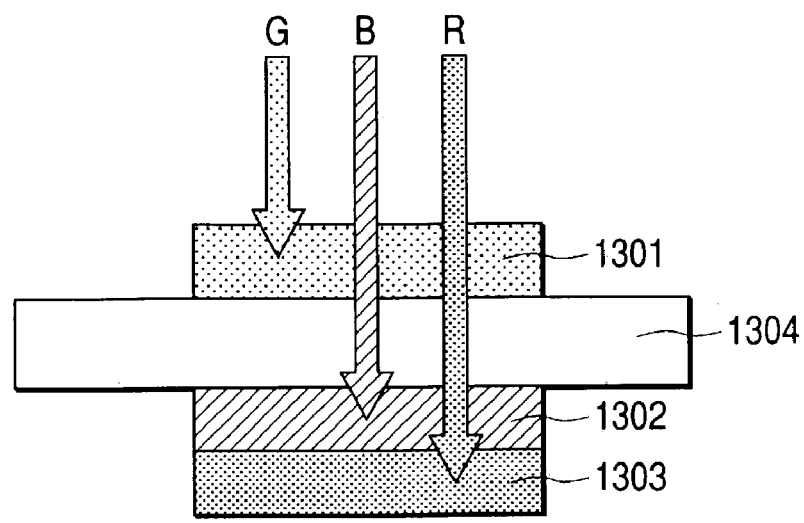
FIG. 17 is a conceptual view showing the light-receiving device of Example 5.

This example represents an example of a color light-receiving device using an organic light-receiving part 1301 for green light as the uppermost layer, an organic light-receiving part 1302 for blue light as the middle layer, and an organic light-receiving part 1303 for red light as the lowermost layer. The sectional structure is shown in FIG. 17.

Cupper phtalocyanine was used for a red absorption layer, rhodamine B was used for a green absorption layer, and tetracene was used for a blue absorption layer.

A ZnO film with the thickness of 100 nm was formed as a transparent electrode on the back surface of a quartz substrate 1304, followed by forming a tetracene film with the thickness of 200 nm, a TPD film with the thickness of 150 nm, a copper phtalocyanine film with the thickness of 150 nm and an Ag film with the thickness of 200 nm.

Then, an ITO film with the thickness of 100 nm, a rhodamine B film with the thickness of 100 nm, and an Ag film with the thickness of 80 nm having an opening of a light-receiving part were formed at the same location on the front surface of the quartz substrate. The stacked-type light-receiving device had an arrangement of the order of Ag having an opening/rhodamine B/ITO/quartz substrate/ZnO/tetracene/TPD/copper phtalocyanine/Ag when viewed from the front surface, namely the photoirradiation direction. Signals corresponding to green, blue and red can be fetched from an ammeter connected to Ag and ITO on the surface side, an ammeter connected to ZnO and tetracene on the back surface side, and an ammeter connected to TPD and an Ag electrode on the back surface side, respectively.

In this configuration, signals could be fetched from the red, blue and green light-receiving devices, in correspondence to red light, blue light and green light, respectively. That is, it was recognized that the light-receiving device functions as a color light-receiving device.

This color light-receiving device was a stacked-type light-receiving device having a high sensitivity to green and a high color separation capability. Also, the green light-receiving part placed on the surface was sensitive to green, and allowed blue light (wavelength of 450 nm) and red light (wavelength of 650 nm) to transmit through in the transmittance level of 50% or more, and thus the light-receiving device had satisfactory characteristics from a practical viewpoint.

EXAMPLE 6

In this Example, the superiority of the image pickup device having a configuration shown in FIG. 6 was demonstrated by numerical estimation.

As shown in FIG. 6, in the image pickup device, the first area 201 for detecting green light, and the second area 202 for detecting blue light and red light are arranged, and in the second area, a light-receiving part 102 for detecting blue light and a light-receiving part 103 for detecting red light are stacked in this order. The light-receiving part constituted by an organic semiconductor having a peak of an absorption spectrum for green light is used, and light-receiving parts made of silicon for blue light and red light are used, as a model case. Blue light and red light are separated using a difference in absorption length in silicon. That is, a configuration based on that of FIG. 11A is used as a model.

Specifically, the image pickup device is an image pickup device in which the first area for detecting light of a first wavelength range, and the second area for detecting light of second and third wavelength ranges are arranged, wherein in the second area, a part for detecting light of the second wavelength-range and a part for detecting light of the third wavelength ranges are stacked, and wherein particularly the first wavelength range corresponds to green, the second wavelength range corresponds to blue, and the third wavelength range corresponds to red.

For the calculation model, a normal distribution having a central wavelength of 0.55 μm and a standard deviation of 0.03 μm as an absorption spectrum similar in shape to a color filter was assumed as an absorption spectrum of the green light-receiving device. Calculations were made on the model in which color separation for red and blue is performed in the depth direction using the dependency of the absorption spectrum of Si on the wavelength. The depths of the blue and red light-receiving parts (PN junctions) in the silicon substrate were 0.15 μm and 2.0 μm, respectively.

The area ratio between the first and second areas was 1, and the numerical aperture of each light-receiving part was 50%.

On the other hand, as Comparative Example 3, a model in which color separation for three colors of blue, green and red are performed in the depth direction using the dependency of the absorption spectrum of Si on the wavelength was used similarly as in the case of Comparative Example 1. The depths of blue, green and red light-receiving parts in the silicon substrate were 0.2 µm, 0.6 µm and 2.0 µm, respectively. Here, the numerical aperture was 50%.

The results of estimating the amount of incident light and the color separation capability for this system are shown in Table 2.

TABLE 2

|  | Comparative Example 3 | Example 6 |
|---|---|---|
| Blue Light Reception Ratio | ~19% | 31% |
| Green Light Reception Ratio | ~19% | 50% |
| Red Light Reception Ratio | ~19% | 31% |
| Blue Color Separation Ratio | ~68% | 91% |
| Green Color Separation Ratio | ~48% | 56% |
| Red Color Separation Ratio | ~53% | 80% |

As apparent from the Table, by applying a configuration based on those shown in FIGS. 6 and 11A in this Example, an image pickup device excellent in sensitivity (surface light reception ratio), and particularly having a high sensitivity to green can be provided. Also, it can be understood that the image pickup device is excellent in color separation.

EXAMPLE 7

In this Example, a color filter allowing red light and blue light to pass through and absorbing green light was placed in the second area in addition to the system of Example 6. That is, a model corresponding to the configuration of FIG. 12 was used.

A filter having an absorption spectrum of a normal distribution having a central wavelength of 0.55 µm and a standard deviation of 0.03 µm was assumed as the color filter. This implies that the color filter is constituted by a material the same as a light absorption material constituting the first light-receiving part.

The results of estimating the amount of incident light and the color separation capability of this system and making a comparison with Comparative Example 3 described previously are shown in Table 3.

TABLE 3

|  | Comparative Example 3 | Example 7 |
|---|---|---|
| Blue Light Reception Ratio | ~19% | 31% |
| Green Light Reception Ratio | ~19% | 50% |
| Red Light Reception Ratio | ~19% | 31% |
| Blue Color Separation Ratio | ~68% | 91% |
| Green Color Separation Ratio | ~48% | ≦100% |
| Red Color Separation Ratio | ~53% | 80% |

Compared with Example 6, the color filter is placed in the second area to prevent green light from being detected in the red and blue light-receiving parts, and therefore the green color separation ratio is further increased.

EXAMPLE 8

In this Example, a CMOS sensor-type image pickup device having a configuration based on that of Example 6 was provided.

In the image pickup device, the first area for detecting green light, and the second area for detecting blue light and red light are arranged, and in the second area, a light-receiving part 102 for detecting blue light and a light-receiving part 103 for detecting red light are stacked in this order similarly as in the case of Example 6.

As shown in FIG. 11A, the blue and red light-receiving parts are provided in the second area on a silicon substrate. On the other hand, the green light-receiving part is provided in the first area on a wiring layer. A transistor and a capacitor are placed in the first area on the silicon substrate.

Also, in this Example, the first and second areas are placed in an enclosed arrangement as shown in FIG. 7D.

In the image pickup device, an organic light-receiving device using a light absorption layer of an organic semiconductor made of merocyanine is used as the green light-receiving part, and light-receiving parts of Si are used for the red and blue light-receiving parts. Blue light is detected in a second light-receiving part 502 provided at a shallow depth from the surface in the silicon substrate 504, and red light is detected in a second light-receiving part 503 provided at a deeper depth. That is, color separation for red and blue is performed using the dependency of the absorption coefficient on the wavelength in silicon. Each light-receiving part is read via an amplifier 505 provided on the silicon substrate.

First, a stacked-type silicon image sensor with a blue light-receiving part (pn junction) and a red light-receiving part stacked on a silicon substrate was fabricated based on the usual method of fabricating a CMOS sensor.

The depths of blue and red light-receiving parts in the silicon substrate were 0.15 µm and 2.0 µm, respectively. A wiring layer was formed, and an organic light-receiving part for green light was stacked thereon to fabricate the sensor. The organic light-receiving part for green light is connected to the silicon substrate by a via wiring (not shown). Each light-receiving part is connected to a silicon transistor of each pixel, and a signal of each light-receiving part is read in the same manner as a usual CMOS sensor. That is, a switch provided in the pixel connected to the point of intersection of X-Y is connected to a vertical shift register, and when the switch is turned on by a voltage from a vertical scan shift register, a signal read from a pixel provided in the same row is read to the output line in the column direction. This signal is read from the output terminal one after another through the switch driven by a horizontal scan shift register. Each pixel has a four-transistor structure.

The green light-receiving part placed in the first area was fabricated by forming a zinc oxide film with the thickness of 100 nm by the spattering method, a merocyanine film with the thickness of 100 nm by vacuum evaporation, and an Ag film with the thickness of 80 nm in the light-receiving part. The Ag film was patterned in such a manner that an opening was provided in the center of the light-receiving part.

For characteristics, a comparison was made with Comparative Example 2 described previously.

Also, as Comparative Example 4, an image pickup device with a usual via-arranged color filter like FIG. 22B was prepared.

The image pickup device of this Example had a reduced level of false color compared to that of Comparative Example 4. Also, the green light-receiving part is placed at the same in-plane location as the wiring and the transistor, and the red and blue light-receiving parts are stacked to achieve effective area usage, thus making it possible to place pixels with high definition. This leads to an advantage that a larger area can be provided for placing the transistor and the wiring, and so on. Also, the sensitivity was also high because no color filter was required.

Also, compared with Comparative Example 2, the image pickup device was excellent in color separation and sensitivity. Particularly, it had a high sensitivity to green and a high color separation capability for green. Compared with Comparative Example 2, in this Example, the sensitivity to red was 1.2 times greater, the sensitivity to blue was 1.2 times greater, and the sensitivity to green was 1.3 times greater. Also, in this Example, the color separation ratio for red was 1.2 times greater, the color separation ratio for blue was 1.1 times greater, and the color separation ratio for green was 1.6 times greater. Also, the light-receiving part has two-layered structure in design, and therefore the structural degree of free is increased in the interconnect wiring and the layout of the transistor.

EXAMPLE 9

Figure 18:
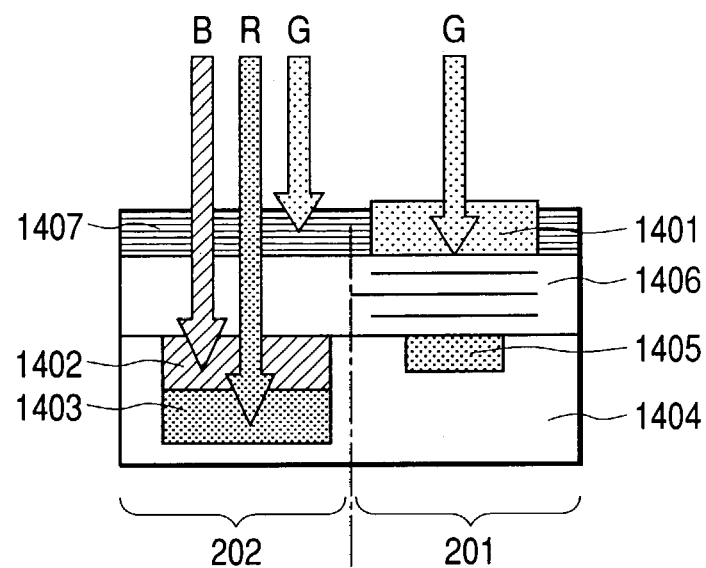
FIG. 18 is a conceptual view showing the light-receiving device of Example 9.

The structure of Example 9 of the present invention is shown in FIG. 18. In this Example, the merocyanine film was formed on the entire surface, namely it was formed not only in the first area 201 but also in the second area 202, and was made to function as a color filter 1407 absorbing green light in the second area, and consequently an image pickup device having a high color separation capability was formed although the sensitivity was slightly reduced. This result supports the result of calculation in Example 7. Reference numeral 1401 denotes a first light-receiving part (G) having a light-receiving layer made of merocyanine, reference numeral 1402 denotes a second light-receiving part (B), reference numeral 1403 denotes a third light-receiving part (R), reference numeral 1404 denotes a silicon substrate, reference numeral 1405 denotes a transistor, CCD or the like, and reference numeral 1406 denotes a wiring layer ($SiO_2$/Al)

EXAMPLE 10

In this Example, a CCD was placed in the first area on a silicon substrate and a red light-receiving part was placed in the second area on the silicon substrate, and an organic light-receiving part for green light was placed in the first area on a wiring and an organic light-receiving part for blue light was placed in the second area.

For reading signals, the signal was read using the CCD on the silicon substrate for not only red but also blue and green.

The CCD was an interline-type CCD.

The first and second areas were placed in a checker arrangement as shown in FIG. 7A.

First, based on a usual method of fabricating a CCD, the red light-receiving part and a charge transfer part were formed on the silicon substrate, a wiring layer was formed thereon, and blue and green organic light-receiving parts were formed thereon. DCM1 was employed for the layer of the blue light-receiving part, and eosine-Y was employed for the layer the green light-receiving part.

The green light-receiving device was formed similarly as in Example 8. For the blue light-receiving part, a zinc oxide film with the thickness of 100 nm was formed by the spattering method, an aluminum trisquinolinol (hereinafter abbreviated as Alq3) with the thickness of 50 nm was formed as an electron transportation layer, a DCM1 film with the thickness of 100 nm was formed as a blue absorption layer, an N,N'-bis(3-methylphenyl)-N,N'-diphenyl-(1, 1'-biphenyl)-4-4'-diamine (hereinafter abbreviated as TPD) film with the thickness of 150 nm was formed as a hole transportation layer, and a polypyridine film with the thickness of 80 nm was formed, by the vacuum evaporation method. The polypyridine film was patterned in such a manner that an opening was provided for the light-receiving part. The TDP film and the polypyridine film were connected to a charge storage part of the silicon substrate via electrodes of aluminum, W-Si and the like.

The image pickup device of this Example had a reduced level of false color and was excellent in color separation and sensitivity.

EXAMPLE 11

Figure 19:
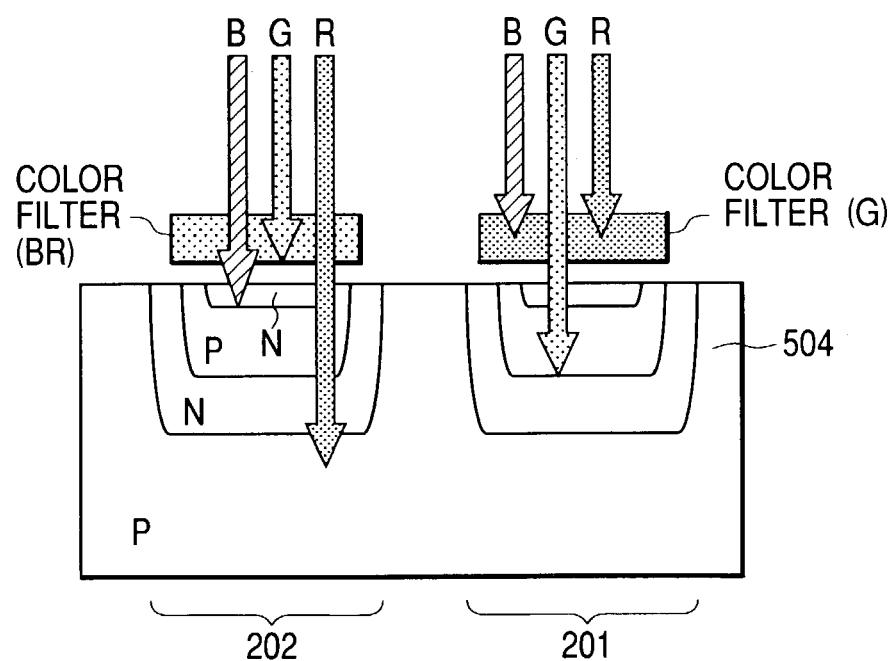
FIG. 19 is a conceptual view showing the light-receiving device of Example 11.

In this Example, as shown in FIG. 19, the first area for detecting green light and the second area for detecting blue light and red light were arranged, and red light, blue light and green light were all detected in light-receiving parts made of silicon.

In this Example, the first area 201 and the second area 202 of the silicon substrate 504 each have a light-receiving part having a structure in which three PN junctions are stacked. The junctions corresponded to the depths of the blue, green and red light-receiving parts, respectively, and their depths were 0.2 µm, 0.6 µm and 2.0 µm, respectively.

Also, a color filter (G) absorbing red light and blue light and allowing green light to pass through was placed in the first area 201, and a color filter (BR) allowing red light and blue light to pass through and absorbing green light was placed in the second area. The first and second areas were placed in a checker arrangement as shown in FIG. 7A.

Green light is detected in the first area, and red light and blue light are detected in the second area. That is, the green light-receiving part is connected with a transistor so that a signal of the green light-receiving part is detected in the first area (detection circuits for red and blue light-receiving parts are not required), and the red and blue light-receiving parts are connected with the transistor so that signals of red and blue light-receiving parts are detected in the second area.

The image pickup device of this Example had a reduced level of false color compared with Comparative Example 4. Also, red and blue light-receiving parts are stacked to achieve effective area usage, and therefore pixels can be arranged with high definition, thereby resulting in an advantage that a larger area can be provided for placing the transistor and the wiring, and so on.

Also, compared with Comparative Example 2, the image pickup device was excellent in color separation and sensitivity. Particularly, it had a high sensitivity to green and a high color separation capability for green. Compared with Comparative Example 2, in this Example, the color separation ratio for red was 1.3 times greater, the color separation ratio for blue was 1.2 times greater, and the color separation ratio for green was 1.6 times greater. Also, the light-receiving part has substantially two-layered structure in design, and therefore the structural degree of free is increased in the interconnect wiring and the layout of the transistor and so on.

EXAMPLE 12

Figure 20:
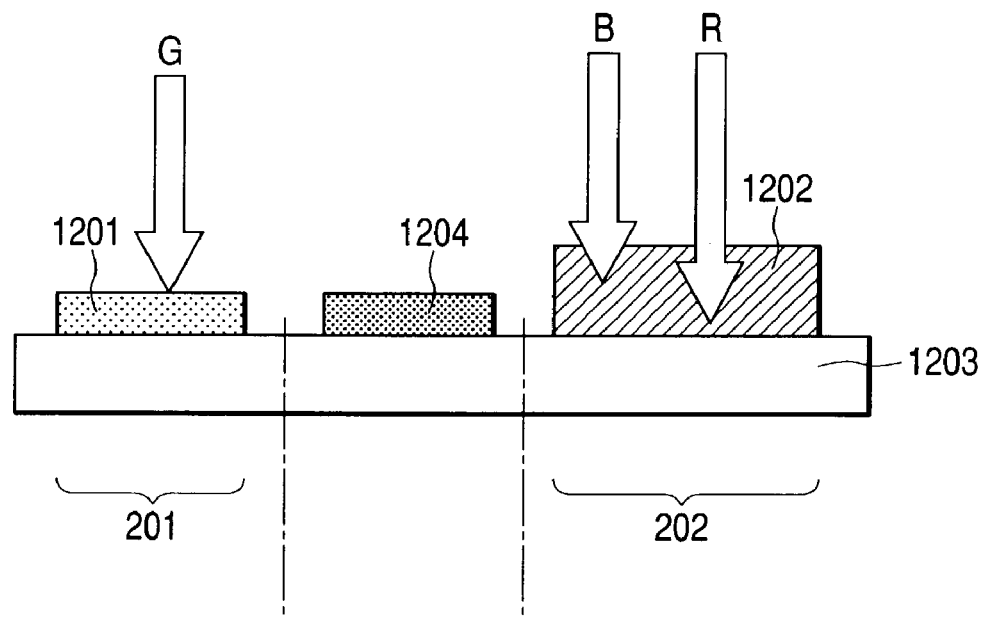
FIG. 20 is a conceptual view showing the light-receiving device of Example 12.

In this Example, an organic light-receiving part for green light 1201 was placed in the first area 201 on a glass substrate 1203, and a light-receiving device 1202 made of a-Si capable of performing color separation for blue and red by the absorption wave length, a TFT made of a-Si, and a capacitor, wiring or the like 1204 were placed in the second area 202 to obtain a line sensor. The sectional structure is shown in FIG. 20. For the arrangement, pixels with the first area surrounding the second area are placed in a line.

First, the glass substrate 1203 having a TFT transistor 1204 made of a-Si was prepared. Subsequently, a p-i-n-i-p-type tandem a-Si light-receiving device 1202 was fabricated. The thicknesses of their types are 80 nm, 700 nm, 180 nm, 90 nm and 10 nm in the order form the bottom layer. This a-Si light-receiving device is capable of making the switch between the reception of light in an upper pin part and the reception of light in a lower pin part by switching the voltage between +2.5 V and −2.5 V. The a-Si was formed by the PECVD (plasma enhanced chemical vapor deposition) method.

In addition, an organic light-receiving device for green light was fabricated.

The organic light-receiving device for green light 1201 was fabricated by forming a zinc oxide film with the thickness of 100 nm in the light-receiving part by the spattering method, followed by forming a merocyanine film with the thickness of 100 nm and a TDP film as a charge transportation layer with the thickness of 1 μm, and forming an Ag film with the thickness of 80 nm as an electrode, by vapor deposition. The Ag film was patterned in such a manner that an opening was provided in the center of the light-receiving part. The Ag electrode was connected to the capacitor made of a-Si, and the TFT via electrodes of aluminum and the like. The signal from each light-receiving device was read via the TFT by the address selection method.

The image pickup device of this Example had a reduced level of false color and was excellent in color separation and sensitivity. Also, in this Example, the signal was read using the TFT using a-Si, thus making it possible to achieve an image pickup device having a large area.

EXAMPLE 13

Figure 21:
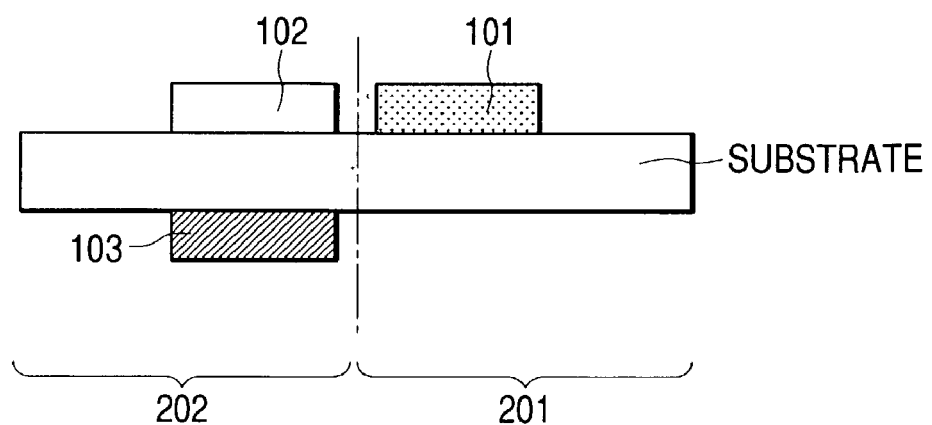
FIG. 21 is a conceptual view showing the light-receiving device of Example 13.

In this Example, a color light-receiving device in which an organic light-receiving part 101 for green light is placed in the first area 201, an organic light-receiving part 102 for red light is placed in the second area 202, and an organic light-receiving part 103 for blue light is placed below the organic light-receiving part 102 for red light with a substrate therebetween as shown in FIG. 21 was provided. The first area 201 was placed in such a manner that it concentrically surrounds the second area 202.

For red, green and blue light-receiving parts, copper phtalocyanine, rhodamine B and tetracene were used, respectively.

A ZnO film was formed with the thickness of 100 nm as a transparent electrode on the back surface of a quartz substrate, followed by forming a copper phtalocyanine film with the thickness of 150 nm and an Ag film with the thickness of 200 nm in the second area to form the red light-receiving part.

Then, an ITO film with the thickness of 100 nm was formed on the front surface of the quartz substrate, followed by placing rhodamine B with the thickness of 100 nm in the first area and placing tetracene with the thickness of 150 nm in the second area, and forming an Ag film with the-thickness 80 nm having an opening of the light-receiving part in each area. The first area has the Ag having opening/rhodamine B/ITO/quartz substrate stacked in this order when viewed from the front surface, namely along the photoirradiation direction, and forms the green light-receiving device. The second area has the Ag having opening/tetracene/ITO/quartz substrate/ZnO/copper phtalocyanine/Ag when viewed from the front surface, namely along the photoirradiation direction, and forms the blue and red stacked-type light-receiving device. Signals corresponding to green, blue and red can be fetched from ammeters connected to electrodes of the light-receiving devices, respectively.

The color light-receiving device of this

Example was compact and had a high color separation capability.

Furthermore, in these Examples, only some examples of image pickup devices and light-receiving devices according to the present invention and image pickup devices employing the light-receiving device are shown, and applications of image pickup devices and light-receiving devices obtained according to the present invention are not limited thereto as a matter of course. For example, circuits associated with functions that are not necessary for intended applications, of components, may be omitted. Conversely, components may be added depending on applications. For example, a configuration in which a transistor is used in conjunction with an organic TFT will be practicable in the future.

What is claimed is:

1. A light-receiving device comprising:
   a first light-receiving part for detecting light of a first wavelength range;
   a second light-receiving part for detecting light of a second wavelength range; and
   a third light-receiving part for detecting light of a third wavelength range,
   wherein said first light-receiving part is composed of an organic semiconductor having an absorption spectral maximum in the first wavelength range and transmitting light of the second and the third wavelength ranges, and is stacked over said second and the third light-receiving parts,
   said second light-receiving part is located in a silicon substrate,
   said third light-receiving part is located in the silicon substrate at a depth deeper than said second light-receiving part, and
   a central wavelength of the first wavelength range is longer than a central wavelength of the second wavelength range and shorter than a central wavelength of the third wavelength range.

2. The light-receiving device according to claim 1, wherein said first light-receiving part has a quantum efficiency curve that has a maximum value at a wavelength ranging from 500 to 600 nm, and both transmittances of wavelengths of 450 nm and 650 nm are 50% or more.

3. The light-receiving device according to claim 1, wherein said second light-receiving part is arranged at a depth of about 0.15 micron from a surface of said silicon substrate, and said third light-receiving part is arranged at a depth of about 1.5 micron from the surface of said silicon substrate.

4. The light-receiving device according to claim 1, wherein said first light-receiving part absorbs green light and allows red light and blue light to transmit therethrough, and the blue light and red light are received by said second and third light-receiving parts, respectively.

5. The light-receiving device according to claim 1, wherein said organic semiconductor has a mobility that is in a range of 0.001 to 1 $cm^2/Vs$.

6. A light receiving device according to claim 1, wherein said third light-receiving part is located under said second light-receiving part.

7. A light receiving device according to claim 1, wherein said third light-receiving part is arranged laterally with said second light-receiving part.

* * * * *

UNITED STATES PATENT AND TRADEMARK OFFICE
CERTIFICATE OF CORRECTION

PATENT NO. : 7,129,466 B2
APPLICATION NO. : 10/428749
DATED : October 31, 2006
INVENTOR(S) : Tatsuya Iwasaki It is certified that error appears in the above-identified patent and that said Letters Patent is hereby corrected as shown below:

COLUMN 2

Line 17, "light receiving" should read --light-receiving--;
    Line 40, "color false." should read --false color.--; and
    Line 67, "above described" should read --above-described--.

COLUMN 3

Line 16, "light receiving" should read --light-receiving--;
    Line 58, "above described" should read --above-described--; and
    Line 64, "above described" should read --above-described--.

COLUMN 4

Line 5, "above" should read --above- --;
    Line 11, "above described" should read --above-described--; and
    Line 24, "constituting" should read --constitutes--.

COLUMN 5

Line 54, "so called a" should read --a so-called--.

COLUMN 6

Line 30, "above described" should read --above-described--; and
    Line 50, "a absorption" should read --an absorption--.

COLUMN 8

Line 34, "centrals" should read --central--; and
    Line 59, "so called a" should read --a so-called--.

COLUMN 9

Line 27, "above described" should read --above-described--;
    Line 46, "so" should be deleted;
    Line 47, "called a" should read --a so-called--; and
    Line 48, "(so called a" should read --(a so-called--.

UNITED STATES PATENT AND TRADEMARK OFFICE
CERTIFICATE OF CORRECTION

PATENT NO. : 7,129,466 B2
APPLICATION NO. : 10/428749
DATED : October 31, 2006
INVENTOR(S) : Tatsuya Iwasaki It is certified that error appears in the above-identified patent and that said Letters Patent is hereby corrected as shown below:

COLUMN 11

Line 45, "($SiO_2/Al$)" should read --($SiO_2/Al$).--; and
    Line 47, "function" should read --function as--.

COLUMN 12

Line 35, "not limited" should read --are not limited--.

COLUMN 16

Line 7, "port" should read --part--; and
    Line 12, "obtained" should read --were obtained--.

COLUMN 17

Line 56, "spattering" should read --sputtering--.

COLUMN 18

Line 48, "spattering" should read --sputtering--.

COLUMN 19

Line 29, "spattering" should read --sputtering--; and
    Line 54, "Cupper phtalocyanine," should read --Copper phthalocyanine,--.

COLUMN 22

Line 57, "spattering" should read --sputtering--.

COLUMN 23

Line 23, "free" should read --freedom--; and
    Line 43, "($SiO_2/Al$)" should read --$SiO_2/Al$).--.

COLUMN 24

Line 2, "spattering" should read --sputtering--; and
    Line 65, "free" should read --freedom--.

UNITED STATES PATENT AND TRADEMARK OFFICE
CERTIFICATE OF CORRECTION

PATENT NO. : 7,129,466 B2
APPLICATION NO. : 10/428749
DATED : October 31, 2006
INVENTOR(S) : Tatsuya Iwasaki It is certified that error appears in the above-identified patent and that said Letters Patent is hereby corrected as shown below:

COLUMN 25

Line 17, "form" should read --from--; and
    Line 30, "spattering" should read --sputtering--.

COLUMN 26

Line 19, close up right margin; and
    Line 20, close up left margin.

Signed and Sealed this

Fifteenth Day of April, 2008

JON W. DUDAS
*Director of the United States Patent and Trademark Office*